US008409951B2

(12) United States Patent
Liang et al.

(10) Patent No.: US 8,409,951 B2
(45) Date of Patent: Apr. 2, 2013

(54) METAL CONTROL GATE FORMATION IN NON-VOLATILE STORAGE

(75) Inventors: Jarrett Jun Liang, San Francisco, CA (US); Vinod Robert Purayath, Santa Clara, CA (US); Takashi Whitney Orimoto, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/439,260

(22) Filed: Apr. 4, 2012

(65) Prior Publication Data
US 2012/0187468 A1   Jul. 26, 2012

Related U.S. Application Data

(62) Division of application No. 12/845,329, filed on Jul. 28, 2010, now Pat. No. 8,278,203.

(51) Int. Cl.
*H01L 21/336* (2006.01)
(52) U.S. Cl. ........ 438/257; 438/197; 438/587; 438/588; 257/E21.179; 257/E21.209
(58) Field of Classification Search .......... 438/197, 438/257, 587, 588; 257/E21.179, E21.209
See application file for complete search history.

(56) References Cited

U.S. PATENT DOCUMENTS

| | | | |
|---|---|---|---|
| 4,888,630 A | 12/1989 | Paterson | |
| 4,989,053 A | 1/1991 | Shelton | |
| 5,768,186 A | 6/1998 | Ma | |
| 5,960,270 A | 9/1999 | Misra et al. | |
| 6,033,963 A | 3/2000 | Huang et al. | |
| 6,251,729 B1 | 6/2001 | Montree et al. | |
| 6,288,419 B1 | 9/2001 | Prall et al. | |
| 6,392,280 B1 | 5/2002 | Besser et al. | |
| 6,514,842 B1 | 2/2003 | Prall et al. | |
| 6,660,588 B1 | 12/2003 | Yang et al. | |
| 6,958,937 B2 | 10/2005 | Forbes | |
| 7,136,302 B2 | 11/2006 | Forbes et al. | |
| 7,256,098 B2 | 8/2007 | Willer | |
| 7,659,569 B2 | 2/2010 | Zheng et al. | |
| 7,674,698 B2 | 3/2010 | Forbes et al. | |
| 2007/0090445 A1 | 4/2007 | Lee et al. | |
| 2007/0126028 A1 | 6/2007 | Higashitani | |
| 2007/0138576 A1 | 6/2007 | Mizukami et al. | |
| 2007/0173018 A1 | 7/2007 | Aritome | |
| 2012/0025289 A1 | 2/2012 | Liang et al. | |

OTHER PUBLICATIONS

Office Action dated Dec. 28, 2011, U.S. Appl. No. 12/845,329, filed Jul. 28, 2010, 7 pages.
Response to Office Action dated Jan. 26, 2012, U.S. Appl. No. 12/845,329, filed Jul. 28, 2010, 9 pages.
Notice of Allowance and Fee(s) due dated Mar. 1, 2012, U.S. Appl. No. 12/845,329, filed Jul. 28, 2010, 15 pages.
Amendment Under 37 C.F.R. §1.312(a) dated Mar. 28, 2012, U.S. Appl. No. 12/845,329, filed Jul. 28, 2010, 5 pages.

*Primary Examiner* — Leonard Chang
(74) *Attorney, Agent, or Firm* — Vierra Magen Marcus LLP

(57) ABSTRACT

Methods for fabricating control gates in non-volatile storage are disclosed. When forming stacks for floating gate memory cells and transistor control gates, a sacrificial material may be formed at the top of the stacks. After insulation is formed between the stacks, the sacrificial material may be removed to reveal openings. In some embodiments, cutouts are then formed in regions in which control gates of transistors are to be formed. Metal is then formed in the openings, which may include the cutout regions. Therefore, floating gate memory cells having at least partially metal control gates and transistors having at least partially metal control gates may be formed in the same process. A barrier layer may be formed prior to depositing the metal in order to prevent silicidation of polysilicon in the control gates.

17 Claims, 18 Drawing Sheets

METAL CONTROL GATE FORMATION IN NON-VOLATILE STORAGE

CLAIM OF PRIORITY

This application is a divisional application of U.S. patent application Ser. No. 12/845,329, entitled "METAL CONTROL GATE FORMATION IN NON-VOLATILE STORAGE," filed Jul. 28, 2010, now U.S. Pat. No. 8,278,203, which is incorporated herein by reference in its entirety.

BACKGROUND

This disclosure relates to non-volatile storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to traditional EEPROM.

For storage elements, some semiconductor memory devices use transistors that have a control gate ("CG") and a floating gate ("FG"), with the floating gate being used to store one or more bits of information. The floating gate is positioned above and insulated from a channel region in a semiconductor substrate. The floating gate is positioned between the source and drain regions. The control gate is provided over and insulated from the floating gate ("FG"). The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

For some devices, programming is achieved by applying one or more programming pulses to the control gate, which may cause electrons from the channel to be injected into the floating gate. When electrons accumulate in the floating gate, the floating gate becomes negatively charged and the threshold voltage of the memory cell is raised so that the memory cell is in a programmed state. Reading the state of a storage element may be achieved by applying one or more read reference voltages to the control gate and sensing a conduction current of the storage element. A relatively strong conduction current indicates that the storage element has a threshold voltage that is below the read reference voltage.

Semiconductor memory devices also have transistors that are used for purposes other than storage elements. Some transistors are used as selection devices to select which groups of storage elements are programmed or read. For example, in an architecture commonly referred to as the NAND architecture, there are "NAND strings" that include a number of storage elements in series with two or more "select gate transistors." Applying an appropriate voltage to the control gates of the select gate transistors can be used to select a group of storage elements. Oftentimes, one storage element of the selected group is selected for programming or reading. For example, one storage element on a NAND string might be selected for programming or reading. Note that typically many NAND strings are selected together, such that many storage elements may be programmed or read together.

It may be desirable for the control gates to have low resistance. Some memory devices may utilize metal for at least a portion of the control gates of the storage elements, which may help to decrease resistance. However, fabricating memory devices with metal control gates presents challenges. One challenge is that metal can be difficult to etch. Therefore, it can be desirable to have a semiconductor fabrication process that does not require etching metal to form control gates. Some semiconductor fabrication processes intentionally form a silicide when forming the control gates, which may help to reduce resistance. However, forming a silicide can also have drawbacks.

DETAILED DESCRIPTION

Disclosed herein are non-volatile storage devices and methods for fabricating non-volatile storage devices. With ever decreasing size of features, forming control gates can be difficult. In some embodiments, at least a portion of the control gates of storage elements (also referred to as "memory cells") are formed using a type of replacement gate technique. There is no need for etching the metal used for the control gates. Moreover, silicidation is not required to form the control gates. Also note that techniques described herein allow various transistors to be fabricated along with the memory cells. For example, select gate transistors and transistors that are outside the memory array ("peripheral transistors") can be formed using the same process steps as the memory cells.

In some embodiments, the control gate of a memory cell has a lower part that is formed from polysilicon and an upper part that is formed from metal. The control gate of a select transistor may also have a lower portion formed from polysilicon and an upper portion formed from metal, although more metal may be used in the control gate of the transistor. In some embodiments, a barrier layer is formed between the polysilicon and the metal, which prevents silicidation.

When forming stacks for floating gate memory cells and transistor control gates, a sacrificial material may be formed at the top of the stacks. After insulation is formed between the stacks, the sacrificial material may be removed to reveal openings. In some embodiments, cutouts are then formed in regions in which control gates of transistors are to be formed. These cutouts in the transistor control gates remove at least a portion of dielectric that is used between the floating gates and control gates of the memory cells. Metal is then formed in the openings, which may include the cutout regions. Therefore, floating gate memory cells having at least partially metal control gates and transistors having at least partially metal control gates may be formed in the same process. In some embodiments, a barrier layer is formed prior to depositing metal in the openings, such that silicidation of the polysilicon may be prevented.

Figure 1:
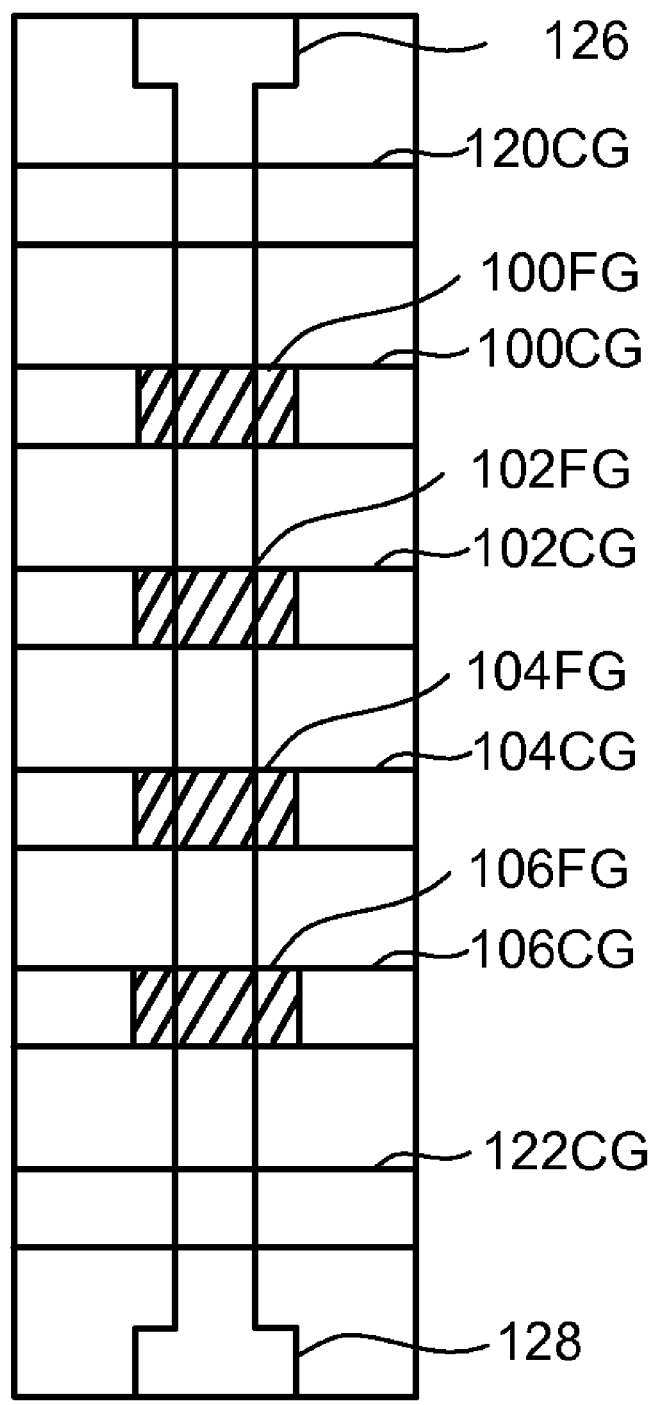
FIG. 1 is a top view of a NAND string.

The techniques described herein are applicable to wide range of memory arrays having memory cells. The following is one example NAND architecture. However, technology disclosed herein is not limited to this example. One example of a flash memory system uses the NAND structure, which includes arranging multiple floating gate transistors in series between two select gate transistors. The memory cells and select gate transistors in series are referred to as a NAND string. FIG. 1 is a top view showing one NAND string. The NAND string depicted in FIG. 1 includes four memory cell transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

A typical architecture for a flash memory system using a NAND structure will include many NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 2:
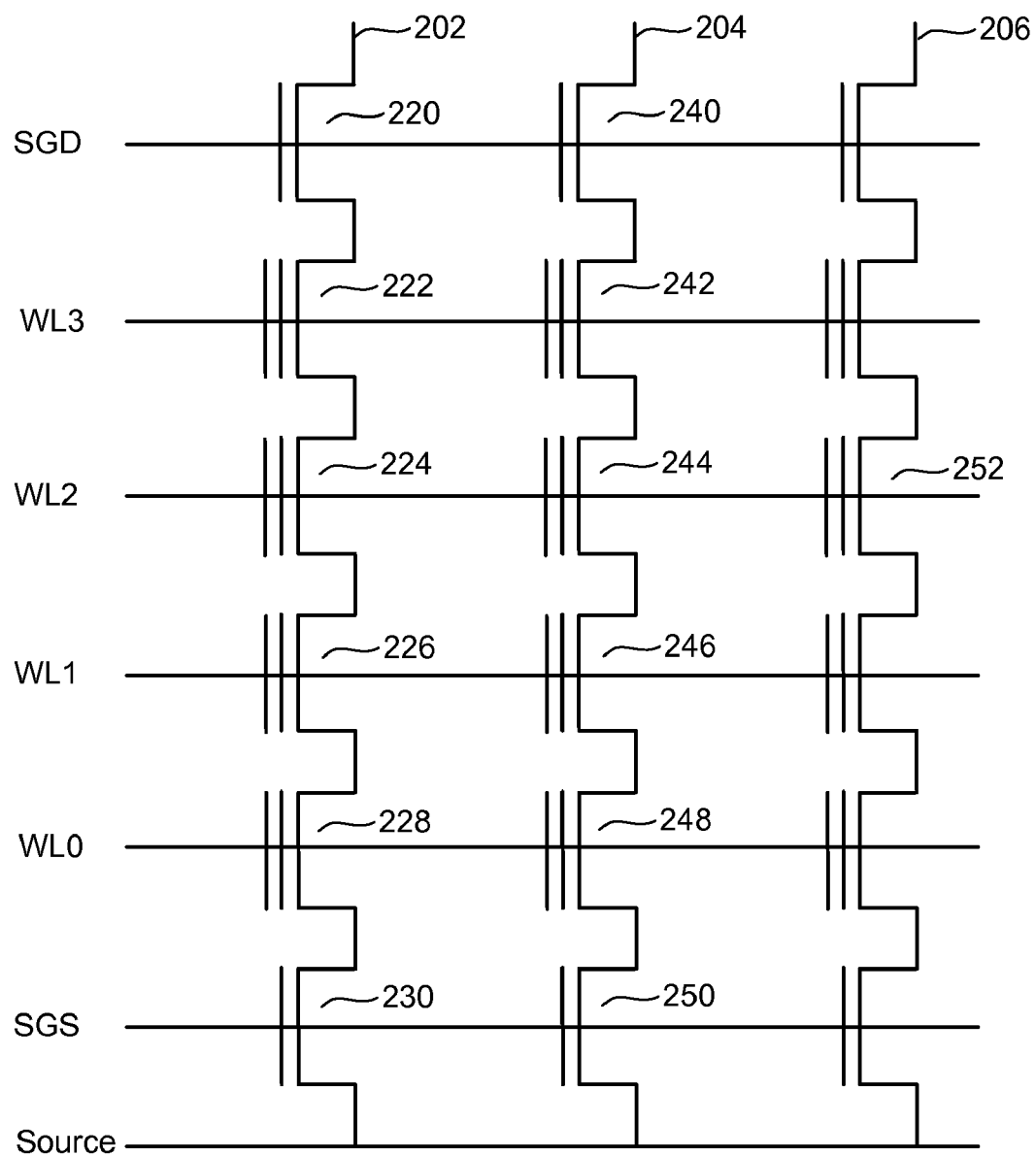
FIG. 2 is a circuit diagram of three NAND strings with associated word lines.

FIG. 2 shows three NAND strings 202, 204 and 206 of a memory array having many more NAND strings. Each of the NAND strings of FIG. 2 includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array.

Note that a NAND string can have fewer or more memory cells than depicted in FIG. 2. For example, some NAND strings will include eight memory cells, 16 memory cells, 32 memory cells, 64 memory cells, 128 memory cells, etc. The discussion herein is not limited to any particular number of memory cells in a NAND string. Furthermore, a word line can have more or fewer memory cells than depicted in FIG. 2. For example, a word line can include thousand or tens of thousands of memory cells. The discussion herein is not limited to any particular number of memory cells in a word line.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory. For example, the following patents describe NOR type flash memories and are incorporated herein by reference in their entirety: U.S. Pat. Nos. 5,095,344; 5,172,338; 5,890,192 and 6,151,248.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
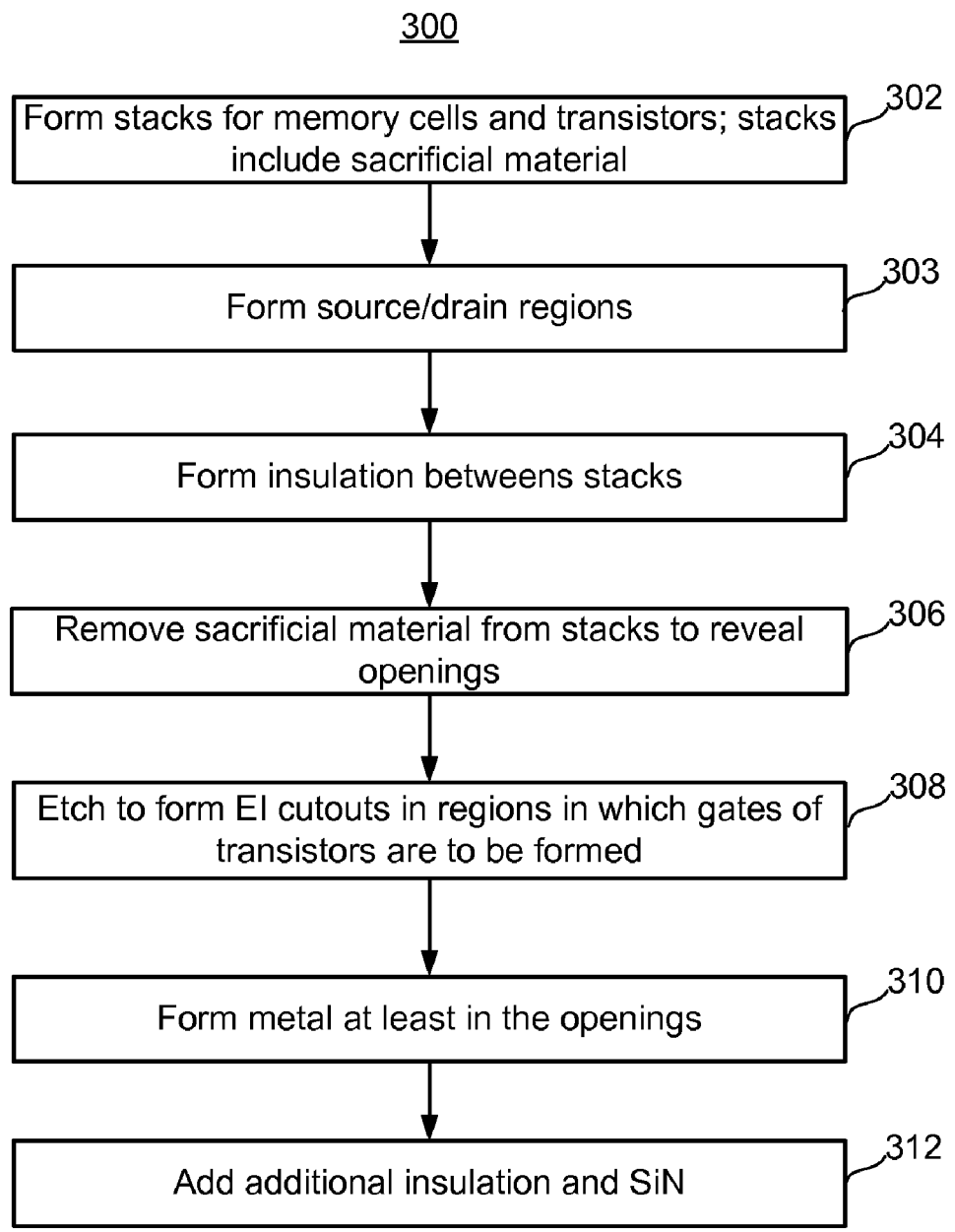
FIG. 3 is a flowchart describing one embodiment of fabricating memory cells and transistors having metal control gates.

FIG. 3 is a flowchart describing one embodiment of a process 300 of fabricating memory cells and transistors. FIG. 3 describes a general process flow with the order of steps presented for convenience of discussion. However, it will be appreciated that the steps can be performed in a different order. This flowchart, as well as other flowcharts describing process flows, does not describe all implant steps, forming contacts to bit lines and source lines, metallizations, forming vias, and passivation, as well as other portions of the manufacturing process known in the art. For example, the formation of shallow trench isolation structures (STI) that may separate NAND strings is not discussed. There are many ways to manufacture memory according to embodiments and, thus, the inventors contemplate that various methods other than that described can be used. For example, the floating gates can be formed to have many different shapes. In some embodiments, the floating gates have a relatively wide base with a relatively narrow stem above the base. FIGS. 5A-5K depict details of results after variation formation steps for some embodiments. FIGS. 6A-6D depict details of results after variation formation steps for some embodiments. FIGS. 5A-5K and FIGS. 6A-6D are side cross sectionals along a portion of a NAND string. Specifically, these Figures show formation of two memory cells and a select gate transistor. A few of these Figures will be referenced when discussing process 300. FIGS. 5A-5K and 6A-6D will be discussed in greater detail with respect to other process flows discussed below.

In step 302, stacks are formed for floating gate memory cells and for transistors. In one embodiment, the floating gate memory cells are part of a NAND string and the transistors include select gate transistors of the NAND string. The process 300 may also be used to form transistors that are outside of the memory array, as well as transistors in the memory array other than select gate transistors. The stacks include sacrificial material that will later be removed and replaced with metal to form portions of control gates for floating gate memory cells, as well as portions of control gates of transistors.

Figure 4A:
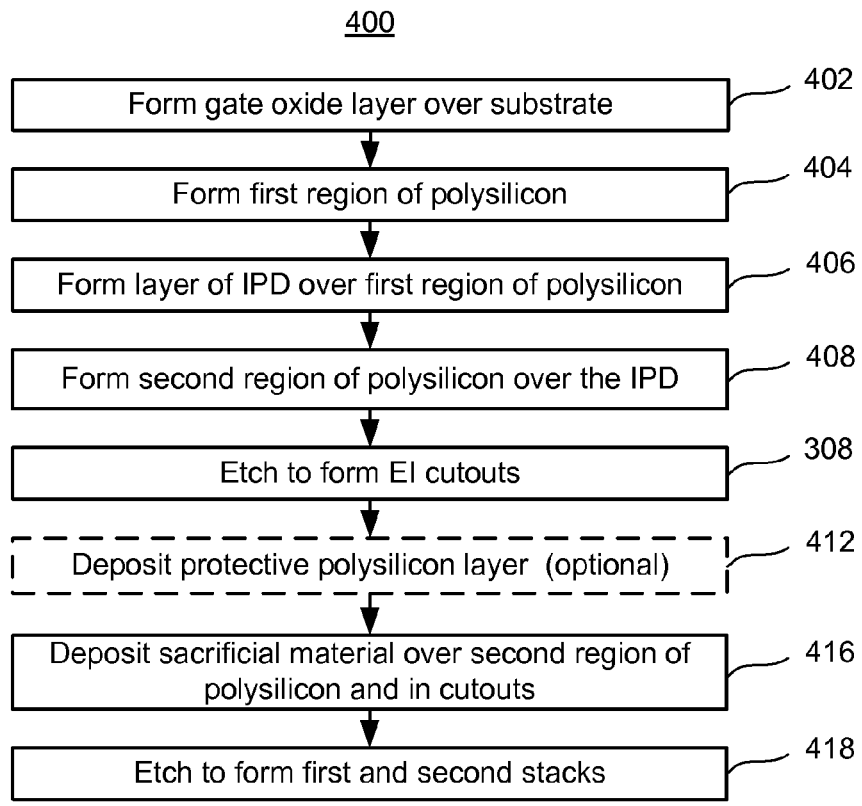
FIG. 4A is a flowchart of one embodiment of a process of forming floating gate and transistor stacks.
Figure 5A:
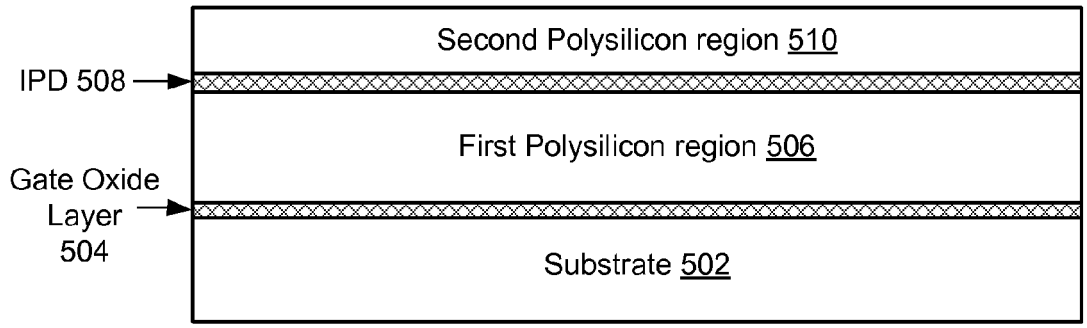
FIGS. 5A, 5B, 5C, 5D, 5E, 5F, 5G, 5H, 5I, 5J, and 5K depict results after various formation steps of the processes of FIGS. 3 and 4A.
Figure 5B:
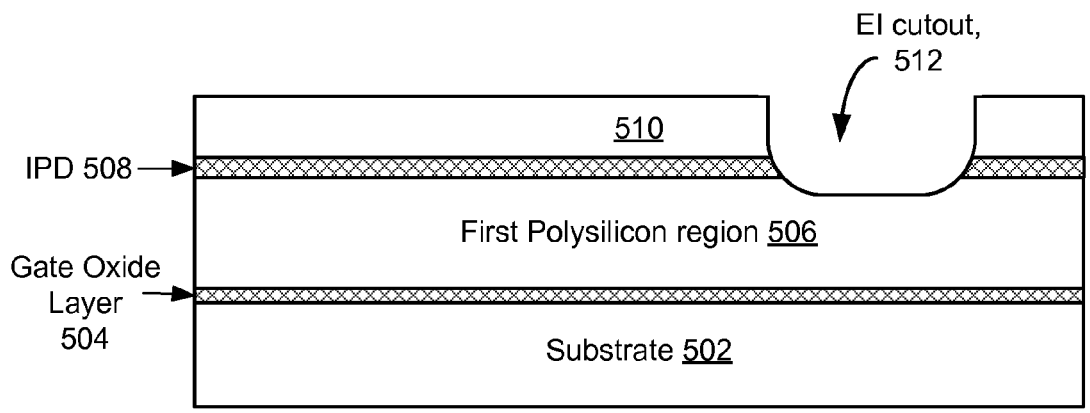
Figure 5C:
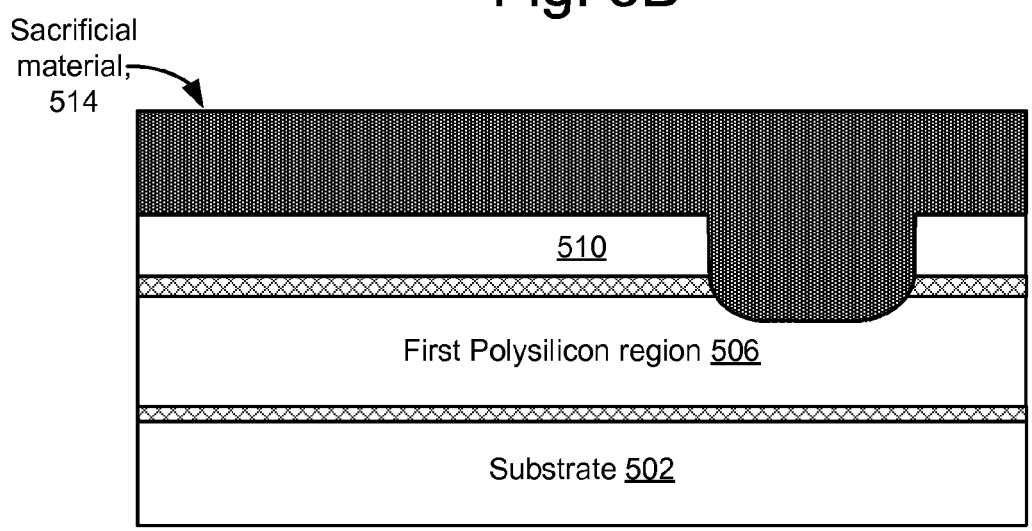
Figure 5D:
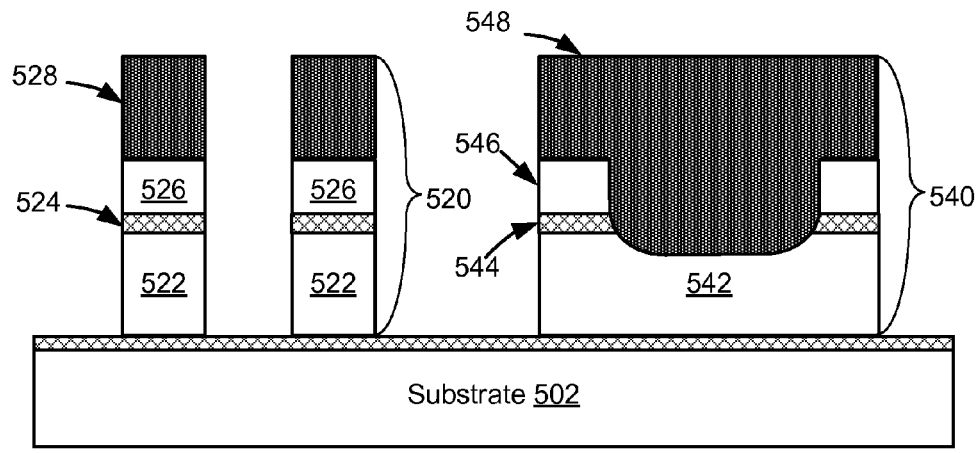

Different embodiments for forming the stacks are discussed below. FIG. 5D depicts results after forming stacks in accordance with one embodiment. FIG. 5D depicts a cross sectional along a portion of a NAND string. Specifically, two floating gate memory cell stacks 520 and one select gate transistor stack 540 are depicted. In this embodiment, a floating gate memory cell stack 520 includes a floating gate 522, memory cell IPD 524, a lower portion of memory cell control gate 526, and control gate sacrificial material 528 that will be replaced with metal to form the upper portions of the control gate. The floating gate 522 and the lower portion of a memory cell control gate 526 may be formed from polysilicon. The transistor stack 540 may be formed from similar materials as the floating gate stacks 520, as will be discussed in more detail below. Specifically, select gate lower polysilicon region 542 may correspond to the floating gate 522, select gate transistor IPD 544 may correspond to the memory cell IPD 524, select gate upper polysilicon region 546 may correspond to the lower portion of the memory cell control gate 526 and transistor gate sacrificial material 548 may correspond to control gate sacrificial material 528. However, the transistor gate sacrificial material 548 may extend further down into the transistor stack 540 than the control gate sacrificial material 528. Therefore, regions 542 and 546 may be formed from polysilicon, whereas region 548 may be replaced with metal during a later process step. Further details of forming the stacks 520, 540 of FIG. 5D are discussed below in connection with the process flow of FIG. 4A.

Figure 6A:
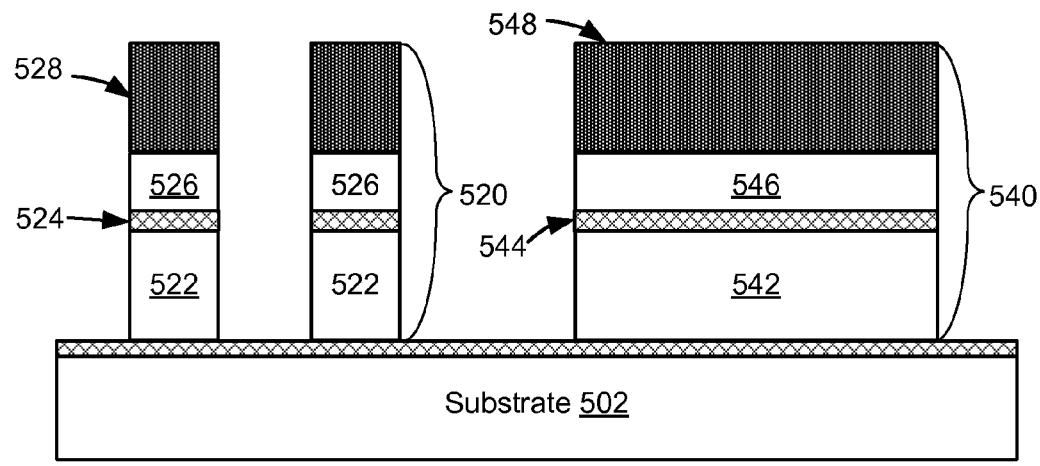
FIGS. 6A, 6B, 6C, and 6D depict results after various formation steps of the processes of FIGS. 3 and 4B.

FIG. 6A depicts results after forming stacks in accordance with another embodiment. In the embodiment of FIG. 6A, the floating gate memory cell stacks 520 are similar to the ones in FIG. 5D. However, the transistor gate stack 540 is different from the embodiment of FIG. 5D. In this embodiment, the transistor gate stack 540 is quite similar to the floating gate stack 520, although it may be wider. Note that select gate transistor IPD 544 still separates the lower and upper regions of polysilicon (542, 544) in the transistor stack 540 of FIG. 6A. Later processing steps will form an "EI cutout" such that the select gate transistor IPD 544 will be broken, which will allow the upper metal portion (to also be formed later) to contact the select gate lower polysilicon region 542. Further details of forming the stacks 520, 540 of FIG. 6A are discussed below in connection with the process flow of FIG. 4B.

Figure 5E:
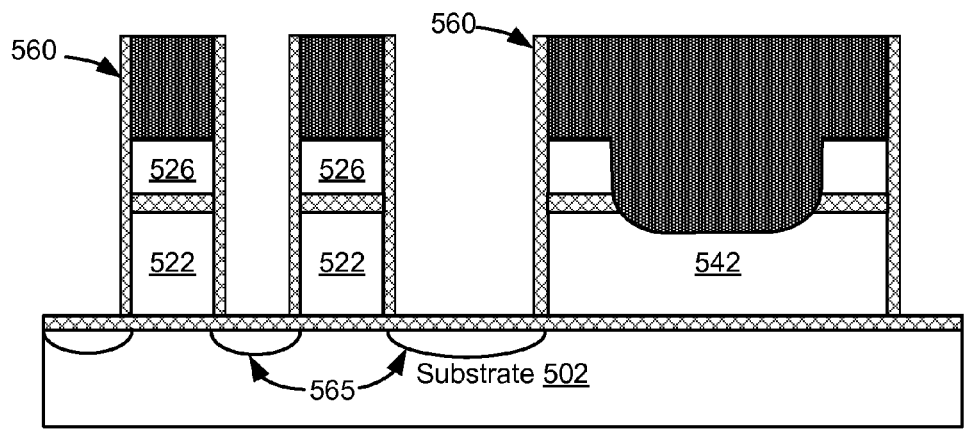

In step 303, source/drain regions are formed between the floating gate stacks. The source drain regions can also be provided by implanting dopants into the substrate, between the floating gate stacks. These source/drain regions connect storage elements of a NAND string. Note that there is also a source/drain region formed between the last storage element the select gate transistor. FIG. 5E depicts the source/drain regions 565 formed in the substrate 502.

Figure 5F:
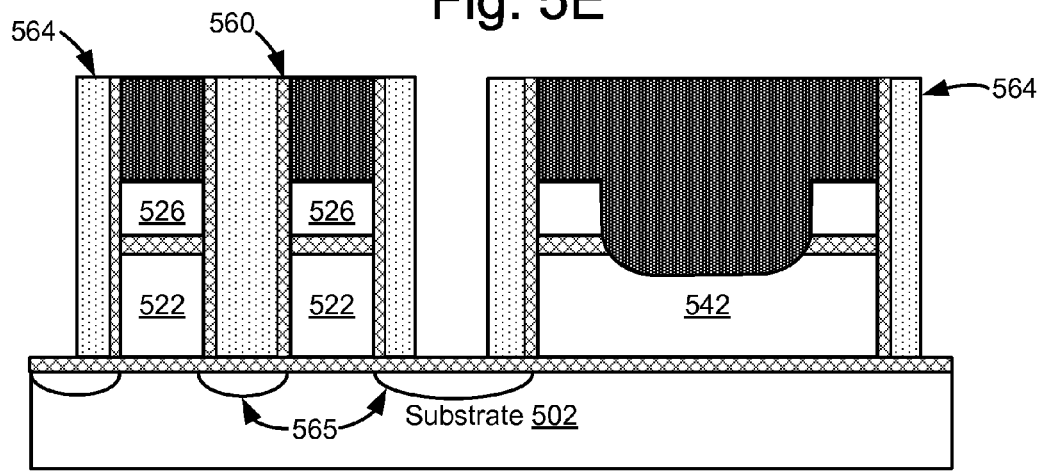
Figure 5G:
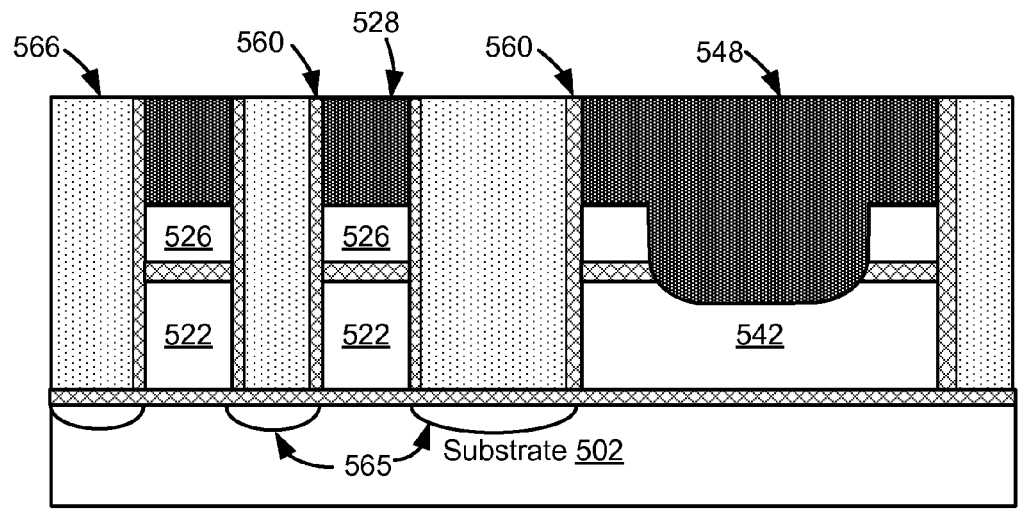
Figure 6B:
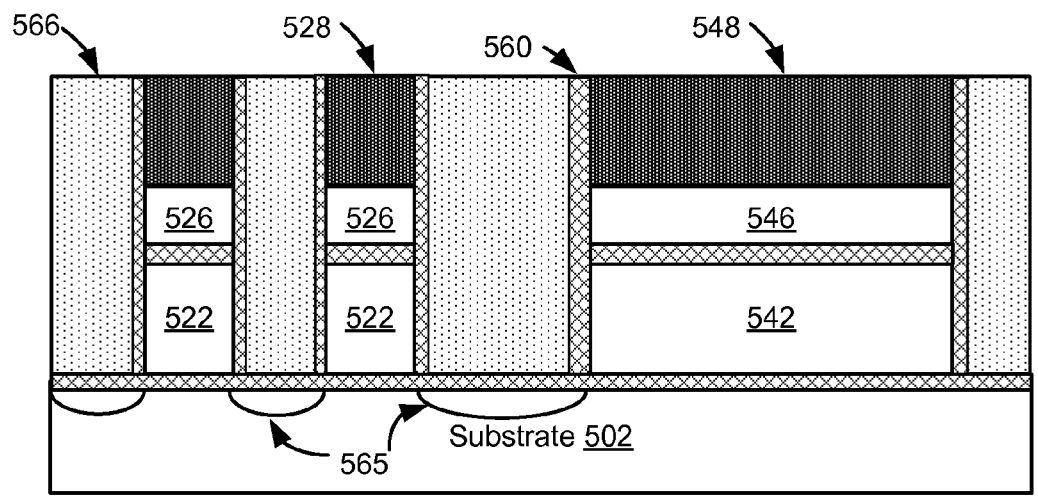

In step 304, insulation is formed between the stacks 520, 540. The insulation may be formed using one or more substeps. For example, first a sidewall oxide layer (e.g., SiO2) may be formed on the sidewalls of the floating gate stack 520 and transistor stack 540. Then, tetra-ethyl ortho-silicate (TEOS) may be formed. In some embodiments, forming the TEOS may include depositing TEOS and etching the TEOS to form a layer over the sidewall oxide layer. Then, additional TEOS may be deposited and planarized. Additional details are discussed below showing formation depicted in FIGS. 5E, 5F and 5G. Note that forming the source/drain regions 565 may be performed after some of the insulation between the stacks 520, 540 has been formed. FIGS. 5G and 6B depict results after step 304 for embodiments. FIGS. 5G and 6B each depict source/drain regions 565, sidewall spacers 560, and insulation 566. In some embodiments, sidewall spacers 560 are SiO$_2$ and insulation 566 is TEOS, although other materials could be used.

In step 306, the sacrificial material in the floating gate stacks and transistor stacks (528 and 548, respectively) is removed to reveal openings. In one embodiment, etching is performed to selectively remove the sacrificial material while leaving other materials such as insulation and polysilicon in place.

Figure 5H:
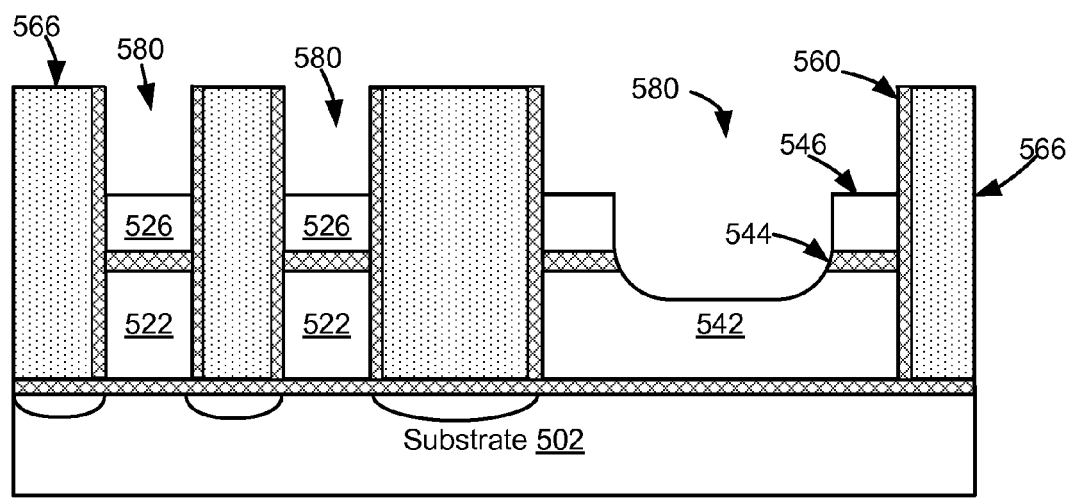
Figure 6C:
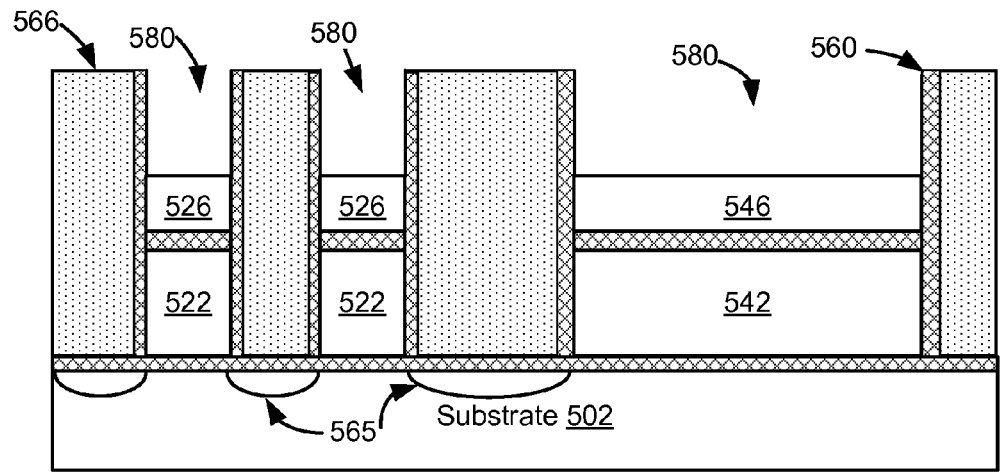

Results after forming the openings are depicted in FIG. 5H for one embodiment. A comparison of FIG. 5G with FIG. 5H shows openings 580 where sacrificial material 528, 548 was in the stacks 520, 540. Note that the sacrificial material 528, 548 may have a high etch selectivity with respect to other materials such that sacrificial material may be removed while leaving other materials in place. For example, the sacrificial material 528, 548 may have a high etch selectivity with respect to sidewall spacers 560, insulation 566, lower portion of memory cell control gate 526, select gate upper polysilicon region 546, and select gate lower polysilicon region 542 such that sacrificial material may be removed while leaving the other materials in place. In an embodiment to be discussed below, there is a protective layer of, for example, polysilicon to protect the select transistor IPD 544 during removal of sacrificial material 548 from the transistor stack 540. Results are depicted in FIG. 6C for another embodiment. A comparison of FIG. 6C with FIG. 6B shows openings 580 where sacrificial material 528, 548 formerly was present.

Figure 6D:
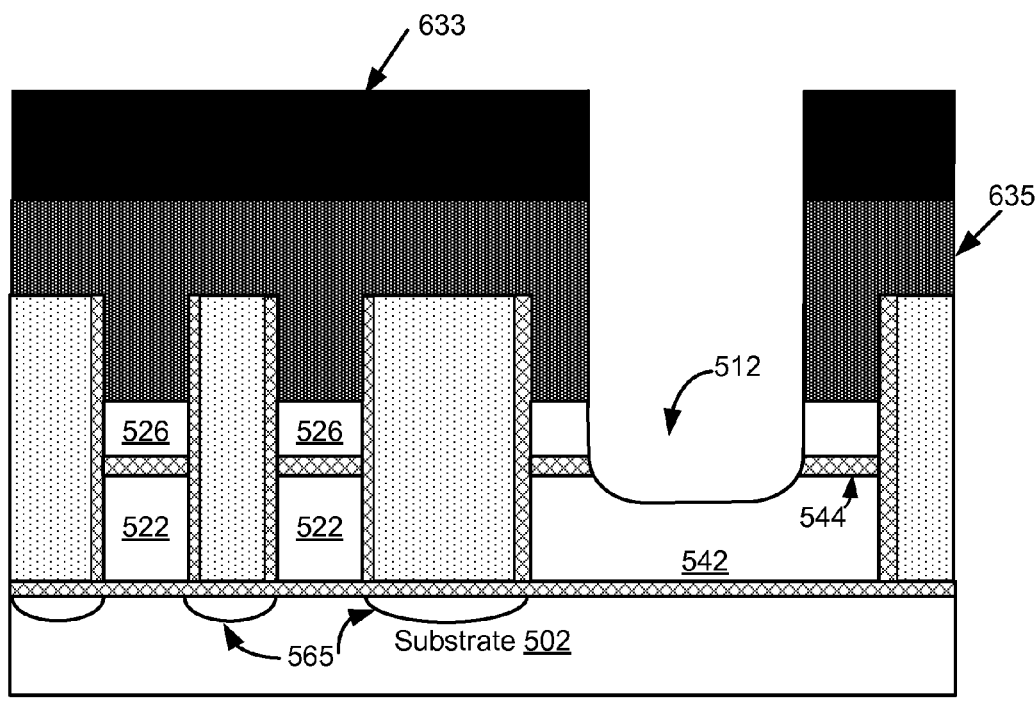

In step 308, "EI cutouts" are formed in regions in which transistor control gates are to be formed. Note that in some embodiments, forming the EI cutouts takes place when forming the transistor stacks 540, which will be discussed in more detail below. If the EI cutouts are to be formed now, they may be formed by patterning and etching. Further details are discussed with respect to the flowchart of FIG. 9. FIG. 6D depicts results after forming the EI cutout 512 using a mask 633 in one embodiment. The EI cutout 512 cuts through at least a portion of the select gate transistor IPD 544 such that the IPD does not prevent conduction between the metal to be formed later and the select gate lower polysilicon region 542.

In step 310, metal is formed at least in the openings 580 that were formed in step 306. The metal is also formed in the EI cutouts whether they were formed prior to or after removing the sacrificial material. In other words, in one embodiment, the EI cutouts 512 are formed prior to depositing the sacrificial material, such that the openings 580 revealed by removing the sacrificial material have a shape that is influenced by the EI cutouts. In another embodiment, the EI cutouts are formed after removing the sacrificial material. Therefore, either way, the metal will be formed in the EI cutouts such that the select gate transistor IPD 544 does not interfere with conduction.

Figure 5I:
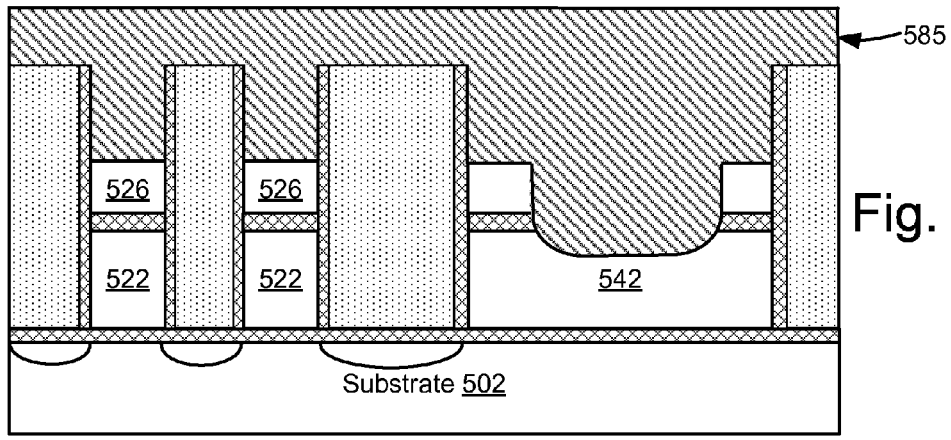
Figure 5J:
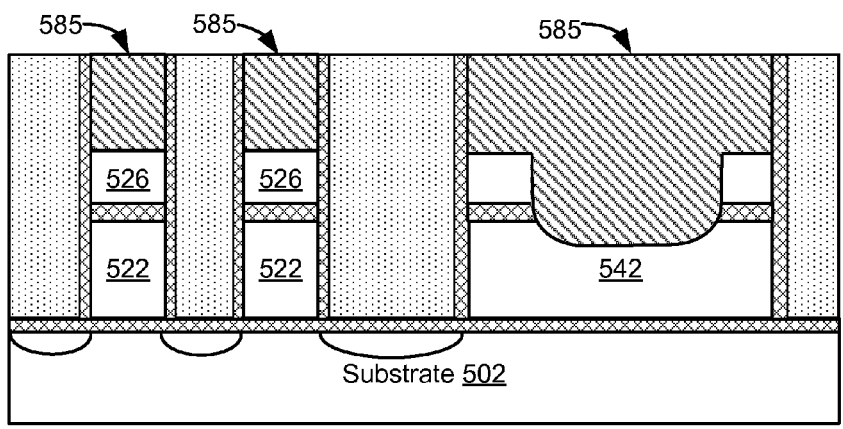

The metal may be tungsten, although another metal may be used. The metal may be formed by chemical vapor deposition (CVD), atomic layer deposition (ALD), plating, or another technique. Initially, the metal may cover the top surface of the insulation, as depicted in FIG. 5I. The metal may be planarized (e.g., chemical mechanical polishing or CMP). Results after step 310 are depicted in FIG. 5J, which shows metal 585 where the openings 580 were. In FIG. 5J, control gates of the non-volatile storage elements are formed at least in part from the metal 585 and adjacent portions the second region of polysilicon 526. Control gates of the transistors are formed at least in part from the metal 585 and adjacent portions of the first region of polysilicon 542. Further details of one embodiment of forming the metal regions are discussed below in connection with the process of FIG. 10.

Figure 5K:
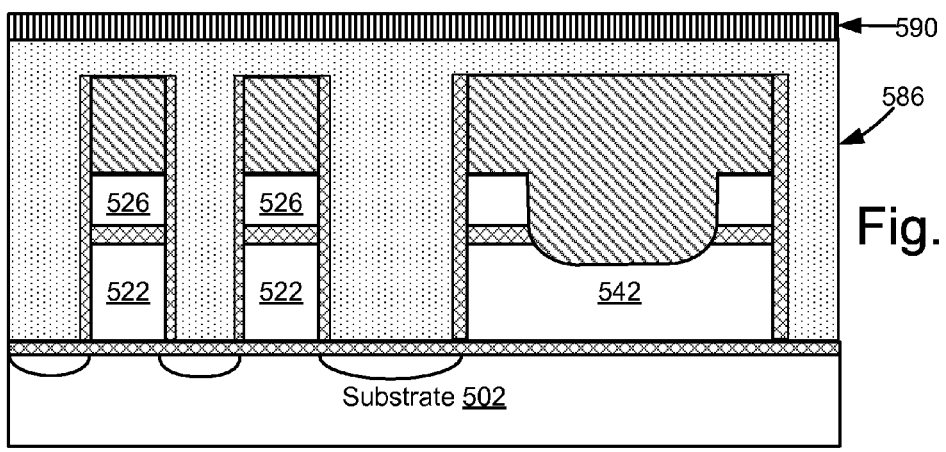
Figure 8A:
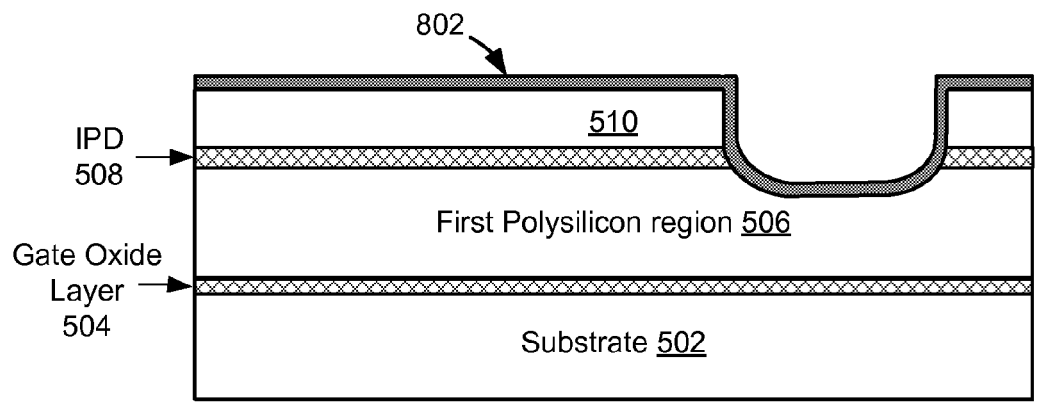
FIGS. 8A, 8B, 8C, and 8D depict results after various formation steps of one embodiment of the process of FIG. 3.
Figure 8B:
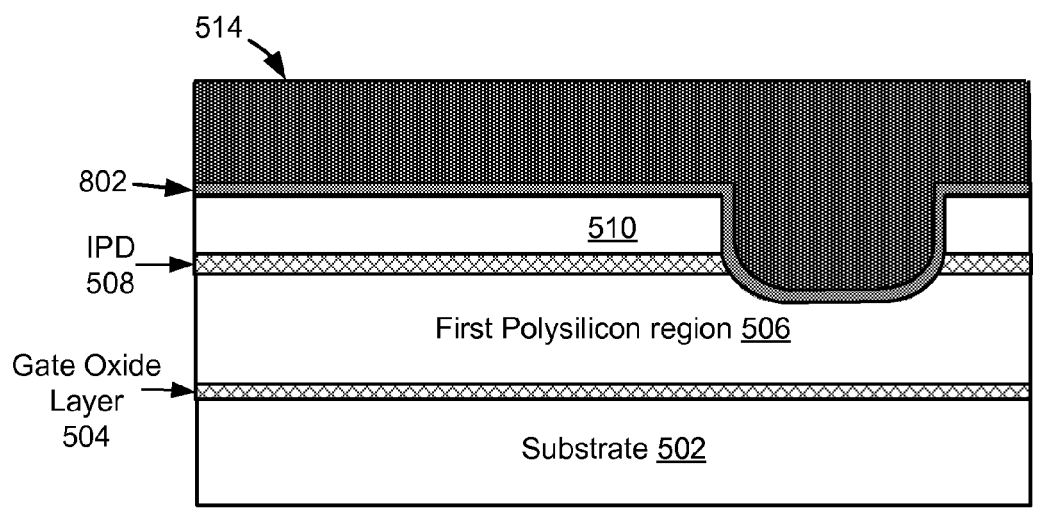
Figure 8C:
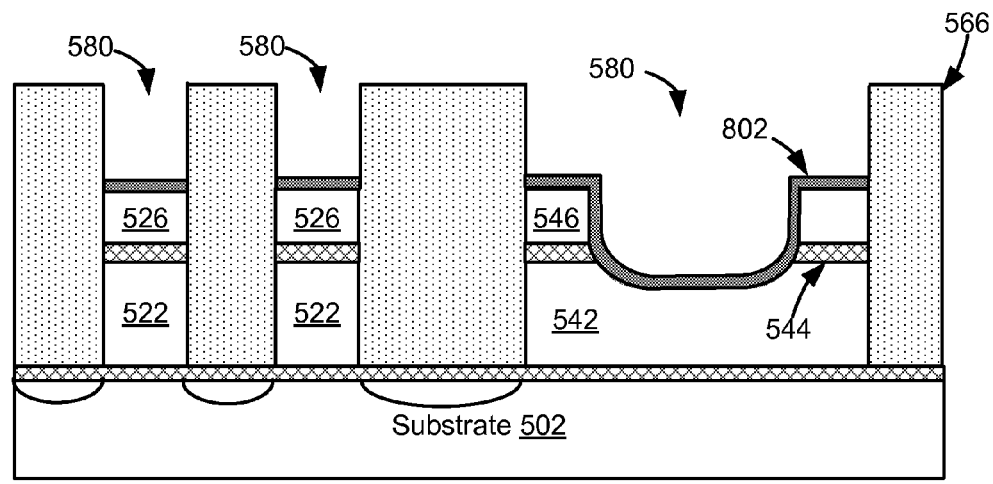
Figure 8D:
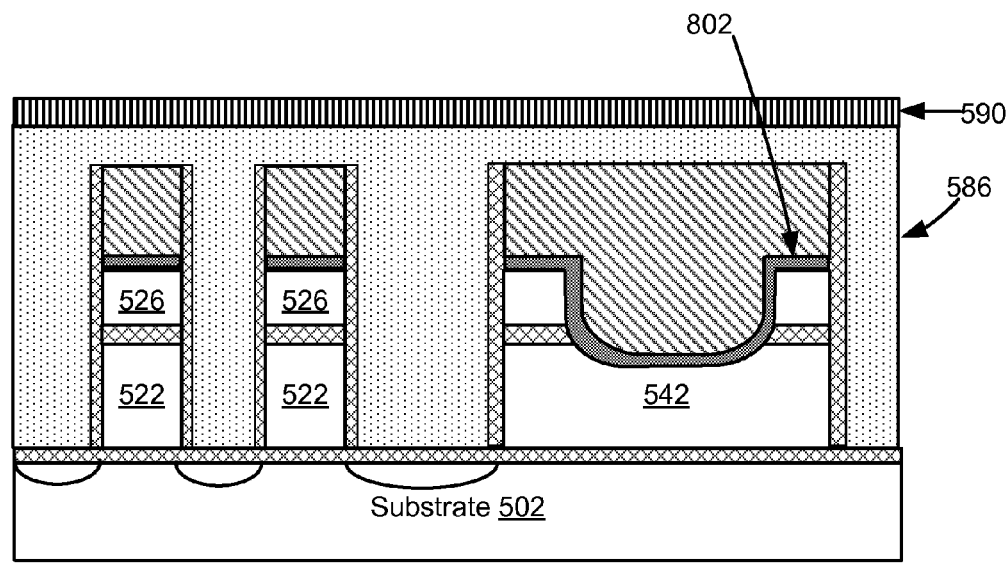
Figure 13A:
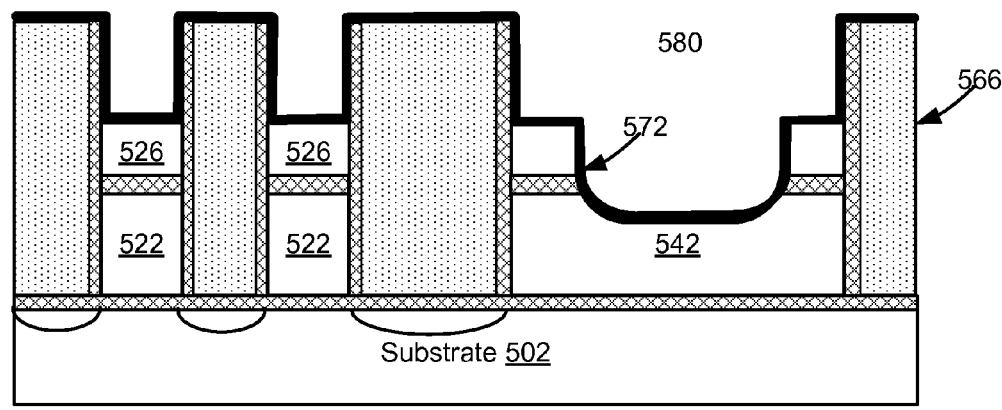
FIGS. 13A, 13B, 13C and 13D depict results after various formation steps of the processes of FIG. 10.
Figure 13B:
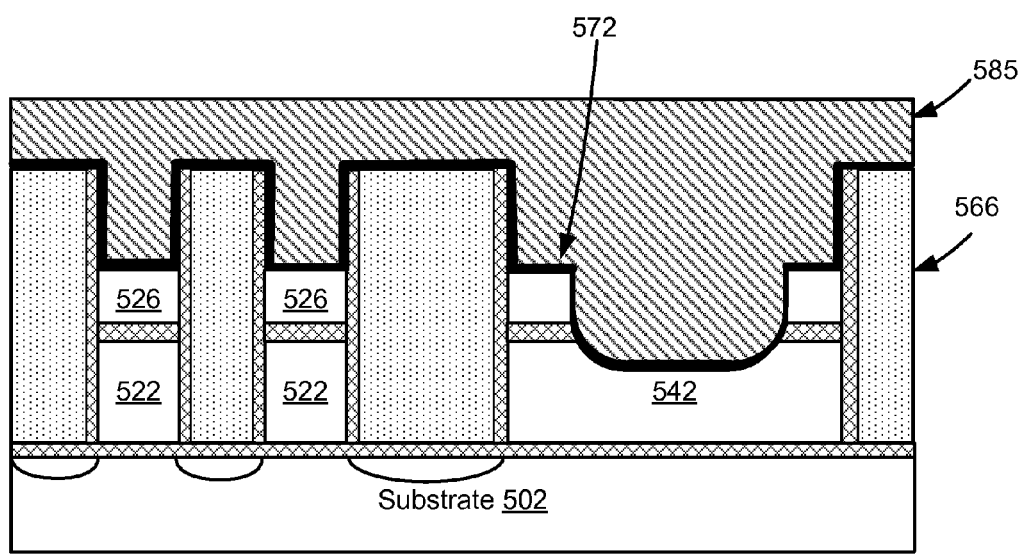
Figure 13C:
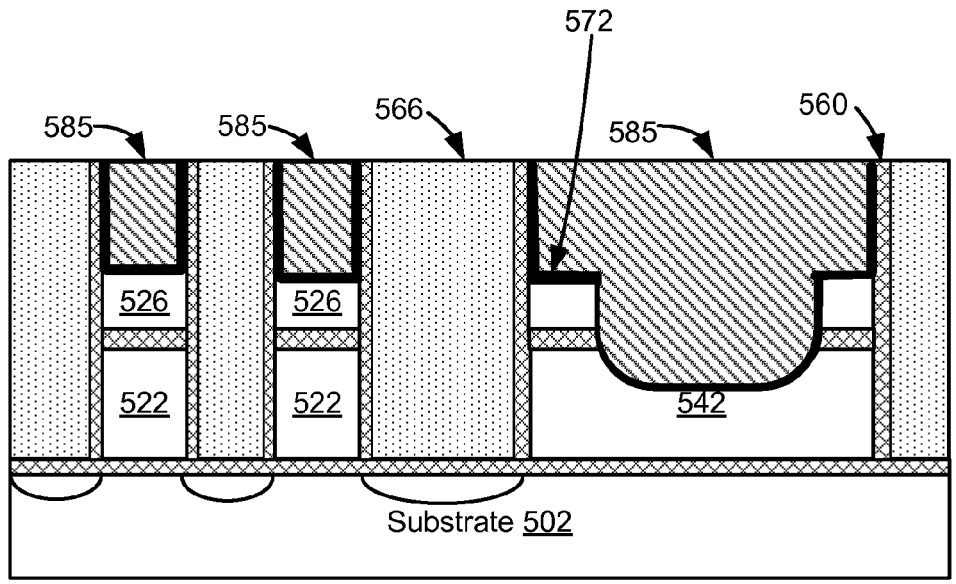
Figure 13D:
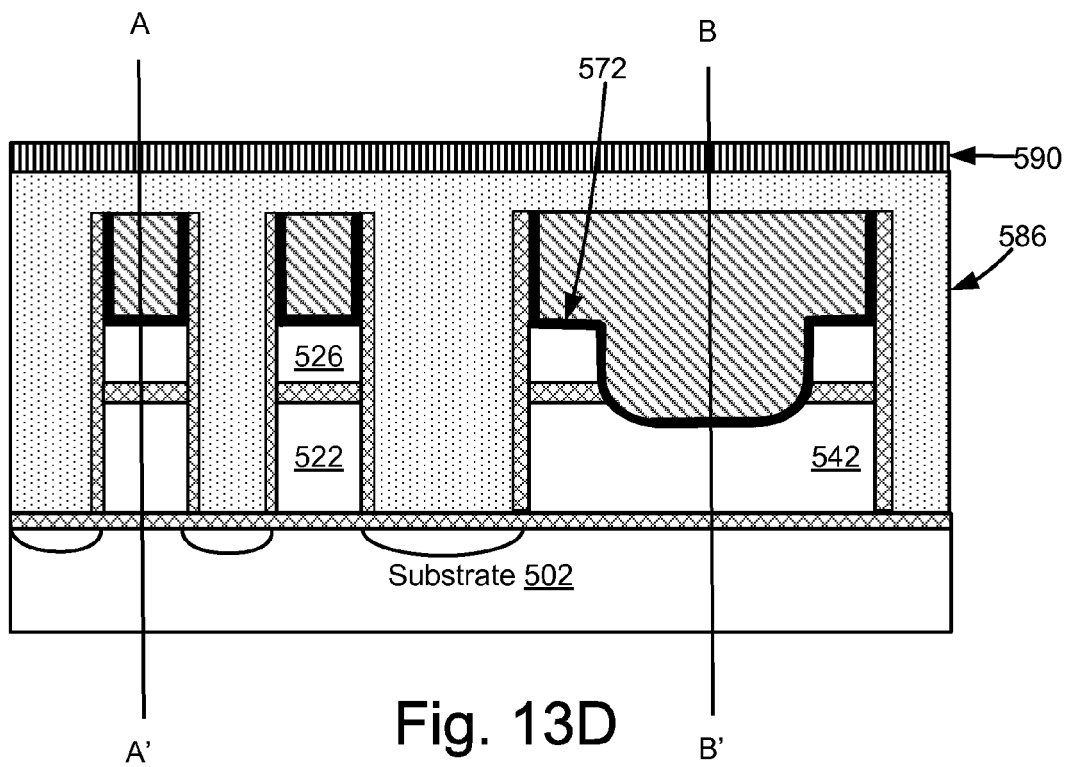

In step 312, an additional layer of insulation may be formed over the metal and the insulation between the stacks. One example material is TEOS. Then, a layer of SiN may be formed over the additional layer of insulation. Results for one embodiment are depicted in FIG. 5K. The insulation is depicted as one large insulating region 586. A layer of SiN 590 resides over the insulation 586. Note that planarizing the top layer of SiN 590 is not required. FIG. 8D depicts results after step 312 for an embodiment in which a protective layer (e.g., polysilicon) 802 is formed between the metal and the polysilicon in at least the transistor control gate. This embodiment will be discussed more fully below. FIG. 13D depicts results after step 312 for an embodiment in which a barrier region 572 is formed between the metal and the polysilicon in at least the transistor control gate. This embodiment will be discussed more fully below.

As mentioned, different embodiments for forming the stacks 520, 540 are contemplated. FIG. 4A is a flowchart of one embodiment of a process 400 of forming floating gate and transistor stacks 520, 540. In process 400, the EI cutout etch is performed while forming the stacks. Therefore, process 400 is one embodiment of the combination of steps 302 and 308 of FIG. 3. FIGS. 5A-5D will be referred to when discussing process 400. FIGS. 8A-8B will also be referred to when discussing process 400. FIGS. 8A-8B depicts results of an embodiment in which a protective layer of polysilicon is formed in the EI cutout region. The protective layer protects the select gate transistor IPD 544 when removing the sacrificial material.

In step 402, a tunnel (or gate) oxide is formed over the substrate 502. For example, oxide material may be grown on top of a silicon substrate. In step 404, a region of polysilicon is formed for eventual formation of floating gates. This region of polysilicon may also be used for a lower portion of control gates of transistors, such as select gate and periphery transistors. For example, referring to FIG. 1, portions of the control gates of drain side select gate 120 and/or source side select gate 122 may be formed from the first region of polysilicon. The polysilicon may be deposited using CVD, PVD, ALD or another suitable method. The polysilicon may be doped, although this is not an absolute requirement. In some embodiments, the polysilicon is doped in-situ. In some embodiments, the polysilicon is doped later. For example, one or more impurities may be implanted after the polysilicon is deposited. In some embodiments, forming the first region of polysilicon 506 includes etching to form polysilicon lines that run in the direction of NAND strings. Shallow trench isolation (STI) structures may also be formed to provide isolation between adjacent NAND strings. Further details are discussed below in connection with the process flow of FIG. 12.

In step 406, an inter-poly dielectric (IPD) layer 508 is formed over and around the first region of polysilicon 506. Note that in some embodiments, the IPD 508 is a conformal layer over portions of the first region of polysilicon 506 that remain after etching to form the parallel lines in the direction of NAND strings. In some embodiments, the IPD 508 is formed from multiple layers of materials. For example, the IPD 508 may be what is sometimes referred to as ONO, which includes alternating conformal layers of silicon dioxide ("O") and silicon nitride ("N"). In one embodiment, the IPD 508 comprises layers of nitride-oxide-nitride-oxide-nitride. Note that the IPD 508 could be formed from a dielectric other than ONO.

In step 408, a second region of polysilicon 510 is formed to be used for lower portions of control gates of memory cells. As mentioned, some of the second region of polysilicon 510 may form a part of the control gates of transistors; however, this is not required. The second region of polysilicon 510 may be doped, although this is not an absolute requirement. Results after step 408 are depicted in FIG. 5A, which depicts substrate 502, gate oxide layer 504, first region of polysilicon 506, IPD 508, and second region of polysilicon 510.

In step 308, etching is performed to form the EI cutouts in the regions for the transistor control gates. As already discussed, the EI cutouts may be formed by patterning and etching. In one embodiment, a mask is formed by depositing and exposing photoresist. One option is to form a hard mask based on the photoresist; however, this is not required. Then, the EI cutouts are etched using the mask as a pattern. Results after step 308 of process 400 are depicted in FIG. 5B, which depicts the EI cutout 512 formed in the second region of polysilicon 510, IPD 508, and first region of polysilicon 506.

After forming the EI cutout 512, there is an optional step 412 of forming a protective layer in the EI cutout region 512. In one embodiment, a layer of polysilicon is formed such that the polysilicon covers at least the exposed IPD 508 in the EI cutout 512. This serves as a protective layer in that it covers the IPD during a later stage of removing the sacrificial material from the EI cutout region. FIG. 8A depicts results after optional step 412. FIG. 8A shows a protective layer 802, which may be formed from polysilicon. The protective layer 802 covers at least the IPD 508 in the EI cutout region 512. The protective layer 802 may also cover other materials in the EI cutouts 512 including exposed portions of the first polysilicon region 506 and exposed sidewall portions of the second polysilicon region 510. The protective layer 802 may also cover the top surface of the second region of polysilicon 510 outside of the EI cutouts 512, although this is not required.

In step 416, a layer of sacrificial material is formed. An example sacrificial material is SiN. Another example material for the sacrificial material is amorphous carbon. In some embodiments, the sacrificial material should have good etch selectively with respect to polysilicon. In some embodiments, the sacrificial material should have good etch selectively with respect to insulating materials that may be used. For example, $SiO_2$ and/or TEOS may be used as insulation. FIG. 5C depicts results after step 416 for the option in which the protective layer 802 was not formed. FIG. 5C shows the sacrificial material 514 covering the top surface of the second region of polysilicon 510 and filling the EI cutout 512. Therefore, the sacrificial material 514 contacts a portion of the first region of polysilicon 506, portions of the IPD 508 in the EI cutout, and side portions of the second region of polysilicon 510 in the EI cutout. FIG. 8B depicts results for the option in which the protective layer of polysilicon 802 was formed. In FIG. 8B, the sacrificial material 514 covers the protective layer of polysilicon 802.

In step 418, etching is performed to form the floating gate and transistor stacks 520, 540. FIG. 5D depicts results after step 418 for one embodiment. In some embodiments, the sacrificial material is used as a hard mask to form the stacks 520, 540. For example, photoresist may be deposited over the sacrificial material 514 and patterned using photolithography. Then, the pattern in the photoresist may be transferred to the sacrificial material 514, which may be used as a hard mask. However, another layer may be deposited over the sacrificial material 514 to serve as a hard mask as an alternative. Either way, the portions of the sacrificial material that remain after forming the stacks (528, 548) should remain for the time being. Etching to form the floating gate and transistor stacks 520, 540 for the embodiment with a protective layer 802 of polysilicon may be similar.

Therefore, process 400 forms floating gate stacks 520 and a transistor stack 540. In process 400, an EI cutout 512 was formed and filled with sacrificial material in the transistor stack. Therefore, process 400 is one technique for performing steps 302 and 308 of process 300.

Figure 4B:
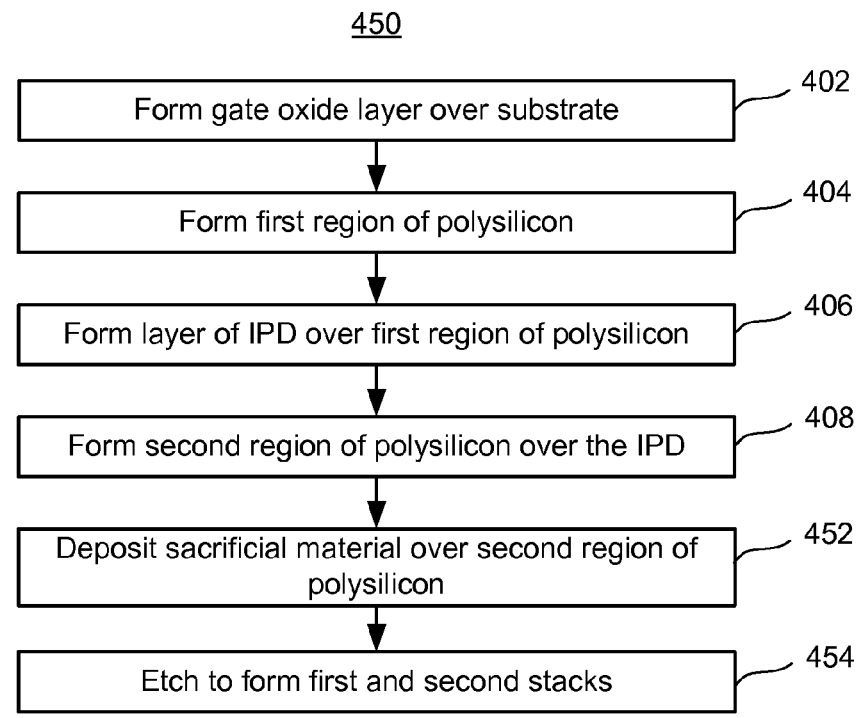
FIG. 4B is a flowchart of one embodiment of a process of forming floating gate stacks and a transistor gate stack.

As mentioned, in another embodiment, the EI cutouts 512 are formed after forming the stacks 520, 540. More particularly, the EI cutouts 512 may be formed after removing the sacrificial material. FIG. 4B is a flowchart of one embodiment of a process 450 of forming floating gate stacks 520 and a transistor gate stack 540 without forming EI cutouts 512. Process 450 is one embodiment of step 302 of FIG. 3. FIGS. 5A and 6A will be referred to when discussing process 450. Step 402-408 of process 450 are similar to steps 402-408 of process 400. Results are depicted in FIG. 5A.

In step 452, sacrificial material 514 is formed over the second region of polysilicon 510. Example materials for the sacrificial material include, but are not limited to, SiN and amorphous carbon. In step 454, etching is performed to form the floating gate 520 and transistor stacks 540. Again, the sacrificial material may be used as a hard mask for forming the stacks 520, 540 by forming a pattern in photoresist and transferring that pattern to the sacrificial material. However, another material could be deposited over the sacrificial material in order to be used as a hard mask. Results after step 542 are depicted in FIG. 6A, which depicts two floating gate stacks 520 and a transistor stack 540. In this case, select transistor IPD 544 remains across the entire width of the transistor stack 540, as the EI cutout 512 has not yet been formed.

Therefore, process 450 is one technique for forming floating gate and transistor control gate stacks 520, 540. After forming the stacks 520, 540 using process 450, steps 303-310 of process 300 may be performed to form the control gates of the memory cells and transistors.

Figure 7:
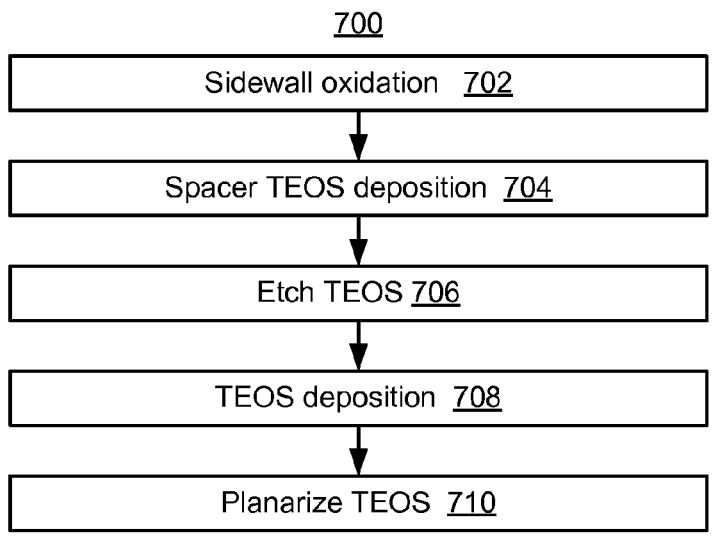
FIG. 7 is a flowchart describing one embodiment of a process of forming insulation between floating gate stacks and a transistor gate stack.

During the discussion of process 300, it was mentioned that insulation is formed between the stacks 520, 540. FIG. 7 is a flowchart showing one embodiment of a process 700 for forming insulation between floating gate stacks 520 and a transistor stack 540. Process 700 is one embodiment of step 304 of process 300. FIGS. 5E-5G and 6B will be referred to when discussing process 700.

In step 702, sidewall oxidation of sidewalls of the floating gate and transistor stacks is performed. In one embodiment, sidewall oxide layers are formed from $SiO_2$, although another material may be used. The sidewall material may be provided over the entire sidewalls of the floating gate and transistor stacks, or over some portion of the sidewalls of the floating gate and transistor stacks. Further, the sidewall material may include one or more layers. The sidewall insulating layers may be provided using different approaches, including oxidizing the sidewalls, depositing an oxide on the sidewalls, or a combination of these two approaches. For sidewall oxidation, the device may be placed in a furnace at a high temperature (e.g., over 1000 degrees Celsius) and with some fractional percentage of ambient oxygen gas, so that the exposed surfaces oxidize. An alternative to high temperature oxide growth is low temperature (e.g., 400 degrees Celsius) oxide growth in high density Krypton plasma. Results after step 702 are depicted in FIG. 5E, which shows a sidewall oxidation layer 560 on the sidewalls of the floating gate stacks 520 and the sidewalls of the transistor gate stack 540.

In step 704, TEOS deposited. In one embodiment, the TEOS is added using chemical vapor deposition (CVD). In step 706, the TEOS is etched. In one embodiment, a reactive ion etch (RIE) is performed. FIG. 5F depicts results after step 706, depicting a TEOS layer 564 over the sidewall oxide layer 560.

In step 708, additional TEOS is deposited. In step 710, the additional TEOS is planarized. Results after step 710 are depicted in FIG. 5G for one embodiment. In FIG. 5G, the sidewall oxide 560 may still be seen. The remaining portion of the insulation comprises TEOS 566. Note that the insulation could be formed from other materials. FIG. 6B depicts results after step 708 for the embodiment in which the EI cutout 512 has not yet been formed.

Figure 9:
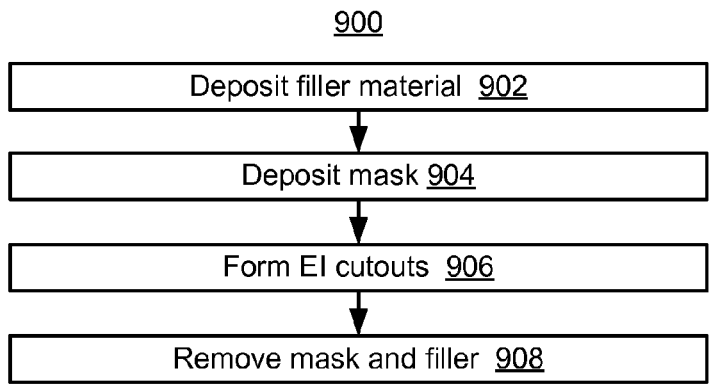
FIG. 9 is a flowchart describing one embodiment of a process of removing sacrificial material and forming EI cutouts.

As mentioned in the discussion of process 300, after forming insulation between the stacks, sacrificial material is removed. In some embodiments, the EI cutouts 512 are formed after sacrificial material is removed. FIG. 9 is a flowchart describing one embodiment of forming EI cutouts. FIGS. 6C, 6D and 5H will be referred to when discussing process 900. Process 900 begins after sacrificial material has been removed to reveal openings 580. FIG. 6C shows openings 580 which were formed by removing sacrificial materials. The sacrificial material 528, 548 may have an high etch selectivity with respect to sidewall spacers 560, insulation 566, lower portion of memory cell control gate 526, and select gate upper polysilicon region 546 such that sacrificial material may be removed while leaving the other materials in place.

In step 902, filler material is deposited in the openings 580. In step 904, a mask material, such as SiN is deposited. The mask may then be patterned using photolithography. For example, photoresist is formed over the mask material, exposed to light and developed. The pattern from the photoresist is then transferred to the hard mask. The pattern from the hard mask is then used to form the EI cutouts 512 in step 906. FIG. 6D depicts a filler material 635 and mask 633, which have been patterned. Material 635 may be spin-on-glass (SOG) or amorphous carbon, for example. Mask 633 may be photoresist. The EI cutout 512 has been formed based on the pattern in the mask 633.

In step 908, the mask 633 and filler 635 are removed. FIG. 5H depicts results after step 908. Note that the results may be similar to results for the embodiment in which the EI cutouts 512 were formed while forming the floating gates and transistor stacks 520, 540.

As previously discussed, in some embodiments, a protective layer of polysilicon is formed to protect the select gate transistor IPD 544 in the cutout region 512. FIG. 8C depicts results after removing the sacrificial material to form openings 580 for an embodiment with a protective layer 802. As noted, an example material for the protective layer 802 is polysilicon and example materials for the sacrificial material include SiN and amorphous carbon. The protective layer should have a high etch selectivity with respect to the sacrificial material such that it may be left in place after removing the sacrificial material. As FIG. 8C depicts, portions of this protective layer 802 still remain after removing the sacrificial material. For example, some of the protective layer 802 still remains above the lower portions of control gates 526. Also, some of the protective layer 802 still remains in the transistor gate stack 540. This protective layer 802 covers the region where the EI cutout 512 was formed. Therefore, it prevents select gate transistor IPD 544 from being exposed when etching the sacrificial material. The protective layer 802 also covers the select gate upper polysilicon region 546, as well as portions of the select gate lower polysilicon region 542 that would otherwise be exposed. Note that by covering the select gate transistor IPD 544, it is protected when the sacrificial material is removed. Otherwise, the select gate transistor IPD 544 might be damaged when removing the sacrificial material. In some embodiments, the select gate transistor IPD 544 is formed from one or more materials that could be etched when etching the sacrificial material. As a specific example, the select gate transistor IPD 544 might have one or more layers of SiN. As the sacrificial material might also be formed from SiN, the protective polysilicon layer 802 prevents the select gate transistor IPD 544 from being etched away. Note that the select gate transistor IPD 544 is not required for proper operation of the transistor. However, even so, it may not be desirable to remove portions of the select gate transistor IPD 544 that reside under the remaining portions of the select gate upper polysilicon region 546.

As mentioned in the discussion of process 300, after openings 580 are formed by removing sacrificial material, metal is formed at least in the openings 580. The metal may also be formed in EI cutout regions 512. As noted, in some embodiments, the openings 580 include the shape of the EI cutouts 512. For example, when removing the sacrificial material as depicted between FIGS. 5G and 5H, the openings 580 formed by removing the sacrificial material include the EI cutout shape 512. In other embodiments, the EI cutouts 512 are formed after the sacrificial material has been removed to form the openings 580. Therefore, the results depicted in FIG. 5H may be arrived at whether the EI cutouts 512 are formed before depositing the sacrificial material or after removing the sacrificial material.

Figure 10:
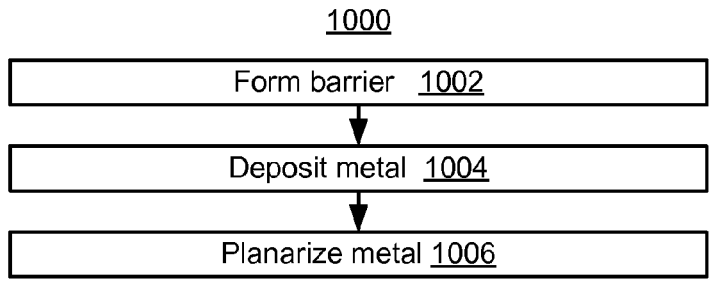
FIG. 10 is a flowchart describing one embodiment of a process of forming metal control gates.

FIG. 10 is a flowchart of one embodiment of a process 1000 of forming metal portions of memory cell control gates after removing sacrificial materials. The process 1000 may also form metal portions of transistor control gates. FIGS. 5H and 13A-13D will be referred to when discussing process 1000. Process 1000 may begin after the results depicted in FIG. 5H are arrived at through various embodiments described herein.

In step 1002, a barrier region is formed. Initially, a layer of material for the barrier region may be formed over the exposed surface. Thus, the barrier region may be formed in the openings that are revealed from removing the sacrificial material, as well as over other areas. FIG. 13A depicts results after step 1002. A barrier layer 572 is depicted in the EI cutout region 512, as well as other areas. The barrier layer 572 may also be present in the opening in the floating gate stacks 520. The barrier layer 572 may prevent silicidation of polysilicon. For example, the barrier layer 572 may cover select gate lower polysilicon region 542, as well as select gate upper polysilicon region 546. Barrier layer 572 may also cover the tops of the lower portions of control gates 526, although that is not required. Therefore, silicidation of those polysilicon regions may be prevented after the metal has been formed for the transistor control gate. Example materials for the barrier layer 572 include, but are not limited to, TiN, WN, and HfN.

In step 1004, metal is deposited. The metal may be deposited into openings 580 that were revealed by removing the sacrificial material. Note that for embodiments in which EI cutouts 512 were formed after removing the sacrificial material, the metal is also formed in the EI cutout regions. Either way, the general shape of the metal may be the same. Results after step 904 are depicted in FIG. 13B, which show metal 585 deposited over the barrier layer 572.

In step 1006, the metal 585 is planarized. Results after step 1006 are depicted in FIG. 13C. FIG. 13C shows metal 585 formed where the openings 580 were, including the EI cutout 512. Therefore, the sacrificial material has been replaced by metal 585. Planarizing the metal may remove a portion of the barrier layer 572. As depicted in FIG. 13C, the portion of the barrier layer 572 that is over TEOS 566 and sidewall spacers 560 has been removed. Note that in some embodiments the metal 585 fills an EI cutout 512 that was formed after the sacrificial material was removed. The metal 585 will serve as upper portions of the control gates of the memory cells, as well as at least a portion of the transistor control gate. Processing may continue by adding additional insulation and a layer of SiN 590. Results are depicted in FIG. 13D.

Figure 11A:
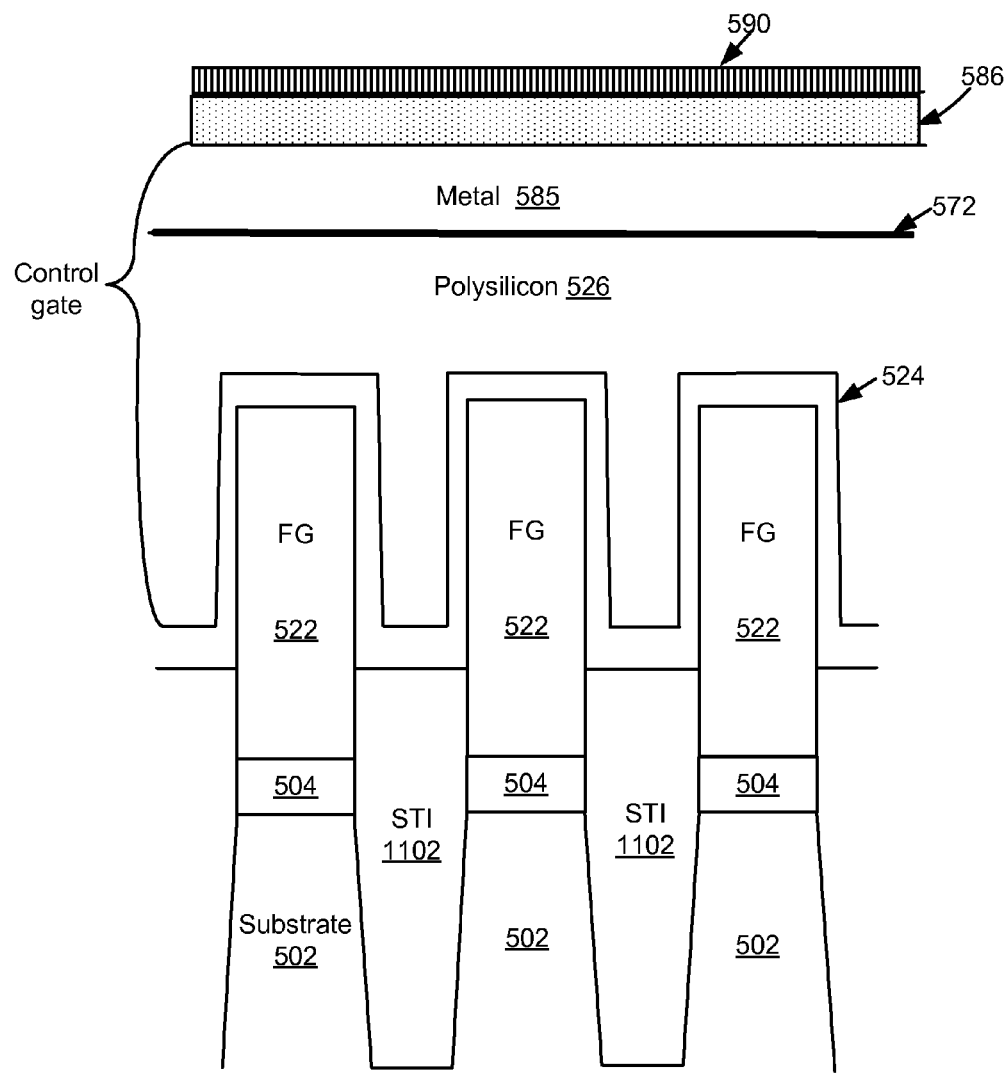
FIG. 11A is a side cross sectional of one embodiment of a row of memory cells.

FIG. 11A depicts a side sectional view of a row of memory cells. FIG. 11A is a cross sectional view taken along line A-A' of FIG. 13D. In general, this perspective is taken along the word line. For example, the perspective is perpendicular to the NAND string. Three memory cells are depicted above the substrate 502. The memory cell IPD 524 is depicted as a conformal layer over the tops and sides of the floating gates 522. The memory cell IPD 524 separates the floating gates 522 from the control gate, which includes lower portion 526 and metal 585. In this embodiment, there is a barrier region 572 between the lower portion 526 and metal 585. However, barrier region 572 is not required. In this example, the lower portion 526 may be formed from polysilicon and may extend downward such that it is between adjacent pairs of floating gates 522, with the memory cell IPD 524 separating regions 522 and 526.

The memory cells are separated by shallow trench isolation structures 1102 (STI) below the memory cell IPD 524. Therefore, the STI 1102 provides isolation between the source/drain regions of one NAND string and the adjacent NAND string. The STI 1102 also provides isolation between channels below the floating gates 522 of one NAND string and the channels of the adjacent NAND string. FIG. 11A also shows insulation 586 and SiN 590 over the control gate.

Figure 11B:
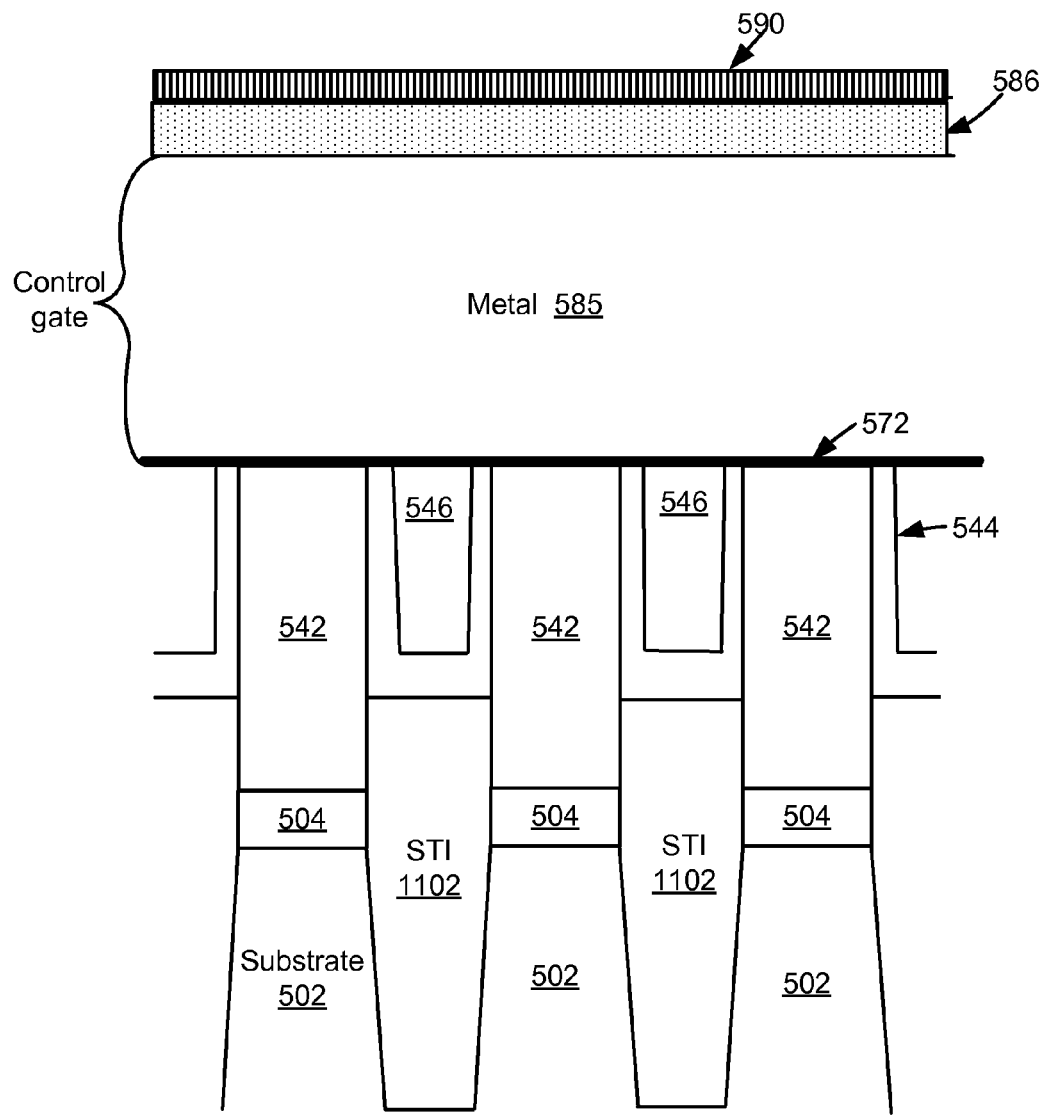
FIG. 11B is a side cross sectional of one embodiment of a row of transistors.

FIG. 11B depicts a side sectional of a row of transistors. FIG. 11B is a cross sectional view taken along line B-B' of FIG. 13D. In general, this perspective is taken along the word line. Three transistors are depicted above the substrate 502. These may be select gate transistors of the same three NAND strings referred to in the example of FIG. 11A. Select gate lower polysilicon region 542 includes the polysilicon from the first region of polysilicon 506 that was used to form the floating gates 522. However, region 542 may be somewhat shorter than the floating gates 522 due to the etching to form the EI cutouts 512 (see FIG. 5B, for example). In some embodiments, a protective layer of polysilicon 802 was formed in the EI cutout 512. In those embodiments, some of the protective layer of polysilicon 802 may still remain over region 542.

For the transistors, the control gates include the metal region 585. Note that the select gate transistor IPD 544 does not separate the metal region 585 from polysilicon region 542 in this cross sectional. However, there may be a barrier layer 572 between metal region 585 and polysilicon region 542. Note that it is permissible to have some of select gate transistor IPD 544 separating polysilicon region 542 from the metal 585 in some places (this is not shown in FIG. 11B). Some of the select gate transistor IPD 544 may reside adjacent to the sides of polysilicon region 542. FIG. 11B also shows polysilicon region 546, which corresponds to the polysilicon 526 that is between the floating gates in FIG. 11A. However, since this polysilicon region 546 is separated from region 542 by the select gate transistor IPD 544 it does not necessarily form part of the transistor control gate.

The transistors are separated by shallow trench isolation structures 1102 (STI) below the select gate transistor IPD 544. Therefore, the STI 1102 provides isolation between the source/drain regions associated with the transistors and the adjacent NAND string. The STI 1102 also provides isolation between channels below the transistors of one NAND string and the channels of the adjacent NAND string.

Note that transistors can also be formed outside of the memory array, as well as within the memory array but not as part of a NAND string. Therefore, it will be understood the any examples herein of forming control gates for transistors as part of a NAND string are one example of forming control gates for transistors using the same process flow as used to form memory cells.

Figure 12:
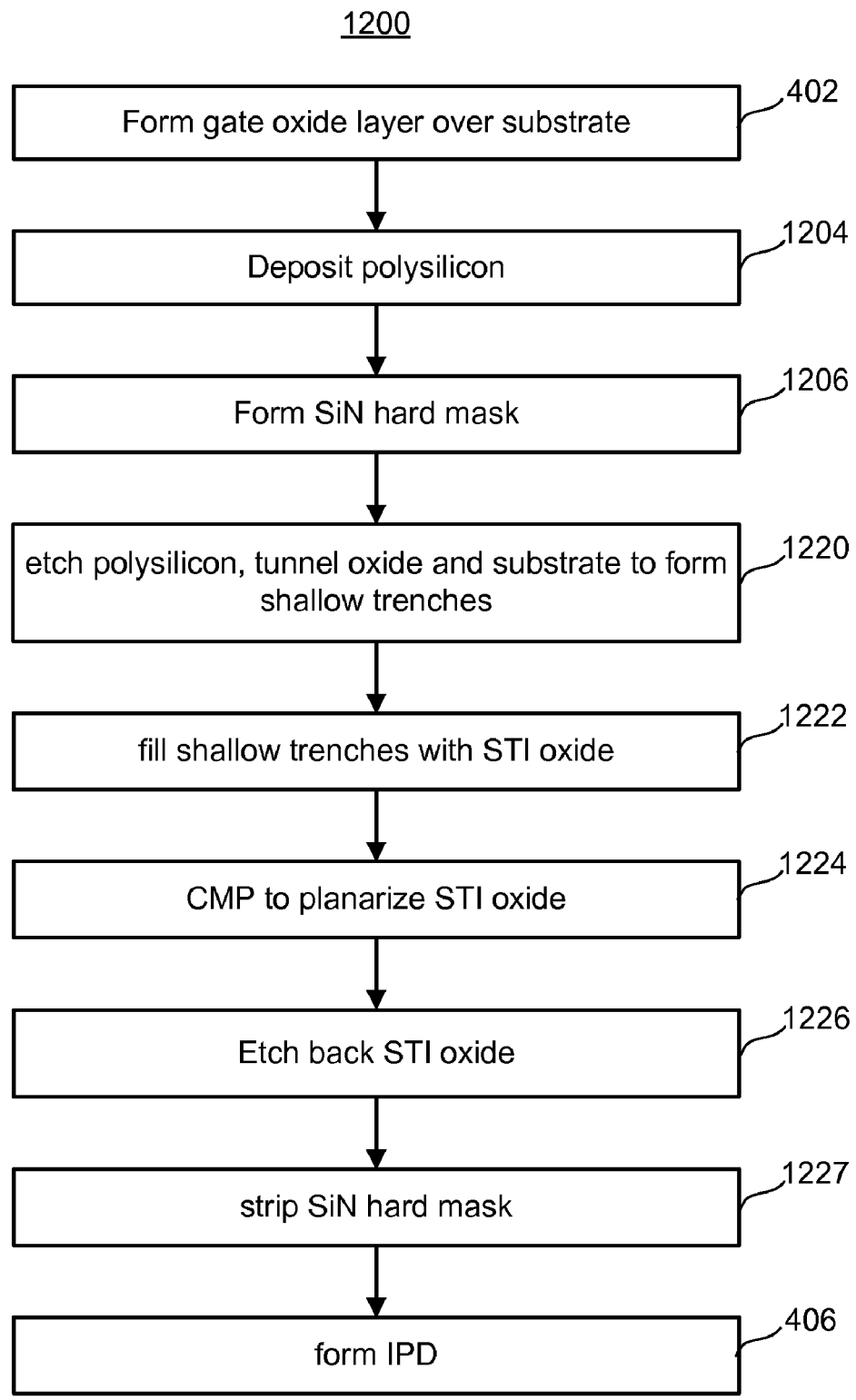
FIG. 12 is a flowchart describing one embodiment of a process of forming polysilicon for floating gates and STI structures between NAND strings.

FIG. 12 is a flowchart of one embodiment of a process 1200 of forming memory cells that are separated by STI structures 1102. Note that process 1200 is one embodiment of forming gate oxide 504, forming a first region of polysilicon 506 and forming an IPD 508. For example, process 1200 can be used when performing steps 402-406 of process 400 or 450. Step 402 of FIG. 12 includes growing oxide material on top of a silicon substrate 502. This oxide will be used to form the tunnel oxide 504. In step 1204, a polysilicon layer that will be used to form the floating gates 706 is deposited over the oxide material using CVD, PVD, ALD or another suitable method. In step 1206, a SiN hard mask is formed over the polysilicon layer to allow etching to form STI structures. Forming the SiN mask may be performed as follows. First, SiN is deposited over the entire polysilicon layer using, for example, CVD. Next, a photoresist layer is added over the SiN. The photoresist is exposed and developed to form a mask pattern. The pattern is transferred to the SiN, thus forming the SiN hard mask.

In step 1206, a SiN hard mask is formed over the polysilicon layer to allow etching to form STI structures. Forming the SiN mask may be performed as follows. First, SiN is deposited over the entire polysilicon layer using, for example, CVD. Next, a photoresist layer is added over the SiN. The photoresist is exposed and developed to form a mask pattern. The pattern is transferred to the SiN, thus forming the SiN hard mask.

Next, shallow trench isolation trenches are formed based on the SiN hard mask. In step 1220, the polysilicon layer, the oxide material, and the top of the silicon substrate 502 are etched. Forming the shallow trench isolation trenches also etches the polysilicon into strips that run in the direction of what will become NAND strings. Thus, the STI structures will separate adjacent NAND strings.

In step 1222, the STI trenches are filled with isolation material such as polysilazane (PSZ), SiO$_2$ (or another suitable material) up to the top of the SiN hard mask using CVD, rapid ALD or another method. In step 1224, chemical mechanical polishing (CMP), or another suitable process, is used to polish the isolation material flat until reaching the SiN hard mask.

Step 1226 is etching back the STI isolation material. Step 1227 is removing the SiN hard mask. In step 406, the inter-poly dielectric 708 is grown or deposited. The IPD 508 may include alternating conformal layers of oxide and nitride. For example, an Oxide Nitride Oxide (ONO) inter-poly dielectric is used. In one embodiment, the IPD 508 comprises nitride-oxide-nitride-oxide-nitride.

The process flow may then continue on with forming the control gates. For example, the second region of polysilicon 510 may be deposited over the IPD 508, as described in step 408 of FIG. 4A or 4B. FIGS. 11A and 11B depict results after the control gates have been formed.

One embodiment disclosed herein includes a method of forming a memory array comprising non-volatile storage elements and transistors. The method comprises forming stacks including a first region of polysilicon, a dielectric, a second region of polysilicon, and a sacrificial material. The dielectric resides between the first and second regions of polysilicon, and the sacrificial material covers the second region of polysilicon. A first group of the stacks is for non-volatile storage elements; a second group of the stacks is for transistors. The method also includes forming insulation between adjacent stacks, removing the sacrificial material to reveal first openings in the first stacks between the insulation and second openings in the second stacks between the insulation, etching through the second region of polysilicon and the dielectric in regions in which control gates of transistors are to be formed to expose the first region of polysilicon, and forming metal at least in the first openings and the second openings. Control gates of the non-volatile storage elements are formed at least in part from the metal in the first openings and adjacent portions the second region of polysilicon. Control gates of the transistors are formed at least in part from the metal in the second openings and adjacent portions of first region of polysilicon.

One embodiment includes a method of forming non-volatile storage elements. The method comprises forming a first region of polysilicon to be used for floating gates of the non-volatile storage elements; forming a dielectric conformably over the first region of polysilicon to be used for an inter-poly dielectric of the non-volatile storage elements; forming a second region of polysilicon conformably over the dielectric, the second region of polysilicon to be used for a lower portion of control gates of the non-volatile storage elements. The method further includes forming a region of a sacrificial material over the second region of polysilicon; etching the sacrificial material, the second region of polysilicon, the dielectric, and the first region of polysilicon to form first stacks for non-volatile storage elements and second stacks for control gates of select gate transistors; forming insulating material adjacent to side of the first and second stacks; removing the sacrificial material to reveal openings between the insulating material over the second region of polysilicon. The method further includes etching the second region of polysilicon and the dielectric in regions in which control gates of transistors are to be formed to expose the first region of polysilicon after removing the sacrificial material, the etchings forms cutout regions. The method further includes depositing metal in the openings and the cutout regions and planarizing the metal. Control gates of the non-volatile storage elements are formed at least in part from the metal and adjacent portions the second region of polysilicon. Control gates of the transistors are formed at least in part from the metal and adjacent portions of first region of polysilicon.

One embodiment includes a method of forming a memory array comprising non-volatile storage elements and transistors. The method comprises forming a first region of polysilicon for floating gates of non-volatile storage elements and for lower portions of control gates of transistors; forming a dielectric conformably over the first region of polysilicon to be used for an inter-poly dielectric of the non-volatile storage elements; forming a second region of polysilicon conformably over the dielectric. The second region of polysilicon may be used for lower portions of control gates of the non-volatile storage elements. The method further includes etching through the second region of polysilicon and the dielectric in regions in which the control gates of the transistors are to be formed to expose the first region of polysilicon; depositing sacrificial material over at least the second region of polysilicon; forming first stacks for non-volatile storage elements from portions of the first region of polysilicon, portions of the dielectric, portions of the second region of polysilicon, and portions of the sacrificial material; and forming second stacks for control gates of transistors from portions of the first region of polysilicon and portions of the sacrificial material. The method further includes forming one or more insulating regions adjacent to the first stacks and the second stacks; removing the sacrificial material to reveal first openings in the first stacks and second opening in the second stacks between the one or more insulating regions; and depositing metal in the first openings and the second openings. Control gates of the non-volatile storage elements are formed at least in part from the metal in the first openings and adjacent portions the second region of polysilicon. Control gates of the transistors are formed at least in part from the metal in the second openings and adjacent portions of first region of polysilicon.

One embodiment includes a memory array comprising non-volatile storage elements including floating gates, control gates, and interpoly dielectric between the floating gates and the control gates. The floating gates include a first region of polysilicon. The control gates include a second region of polysilicon and a region of metal conformably over the second region of polysilicon. The memory array also comprises select gate transistors coupled to the non-volatile storage elements. The select gate transistors include control gates that include polysilicon and metal. Each of the transistor control gates includes a cutout region that includes metal instead of the second region of polysilicon and the interpoly dielectric. The cutout region resides at a level at which the second region of polysilicon and the interpoly dielectric reside in the non-volatile storage elements.

Herein, numerous examples of have been presented. However, it will be understood that other semiconductors might be used. In the above examples, the substrate is made of silicon. However, other materials known in the art can also be used such as Gallium Arsenide, etc.

The foregoing detailed description of embodiments has been presented for purposes of illustration and description. It is not intended to be exhaustive or to limit embodiments to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method of forming a memory array comprising non-volatile storage elements and transistors, the method comprising:

forming a first region of polysilicon for floating gates of non-volatile storage elements and for lower portions of control gates of transistors;

forming a dielectric conformably over the first region of polysilicon to be used for an inter-poly dielectric of the non-volatile storage elements;

forming a second region of polysilicon conformably over the dielectric, the second region of polysilicon for lower portions of control gates of the non-volatile storage elements;

etching through the second region of polysilicon and the dielectric in regions in which the control gates of the transistors are to be formed to expose the first region of polysilicon;

depositing sacrificial material over at least the second region of polysilicon and the exposed portion of the first region of polysilicon;

forming first stacks for non-volatile storage elements from portions of the first region of polysilicon, portions of the dielectric, portions of the second region of polysilicon, and portions of the sacrificial material;

forming second stacks for control gates of transistors from portions of the first region of polysilicon and portions of the sacrificial material;

forming one or more insulating regions adjacent to the first stacks and the second stacks;

removing the sacrificial material to reveal first openings in the first stacks and second opening in the second stacks between the one or more insulating regions; and depositing metal in the first openings and the second openings, control gates of the non-volatile storage elements are formed at least in part from the metal in the first openings and adjacent portions the second region of polysilicon, control gates of the transistors are formed at least in part from the metal in the second openings and adjacent portions of first region of polysilicon.

2. The method of claim 1, further comprising depositing a barrier layer at least over the exposed first region of polysilicon after etching through the second region of polysilicon and the dielectric and prior to forming metal in the first openings and the second openings.

3. The method of claim 2, wherein the barrier layer includes a material that prevents silicidation of the first region of polysilicon.

4. The method of claim 3, wherein the barrier layer includes one or more of titanium nitride, tungsten nitride, and hafnium nitride.

5. The method of claim 1, wherein the etching through the second region of polysilicon and the dielectric exposes portions of the dielectric, and further comprising depositing a protective layer of polysilicon at least over the exposed dielectric prior to depositing the sacrificial material.

6. The method of claim 5, wherein the dielectric and the sacrificial material each include nitride.

7. The method of claim 1, wherein the etching the second region of polysilicon and the dielectric creates cutout regions where control gates of the transistors are to be formed, the cutout regions expose portions of the dielectric, and further comprising depositing a protective layer of polysilicon at least over the exposed dielectric in the cutout regions prior to depositing the sacrificial material in the cutout regions.

8. The method of claim 1, wherein the etching the second region of polysilicon and the dielectric creates cutout regions where control gates of the transistors are to be formed, the cutout regions expose portions of the dielectric, and further comprising depositing a protective layer over the exposed dielectric in the cutout regions prior to depositing the sacrificial material in the cutout regions, the protective layer has a high etch selectivity with respect to the sacrificial material.

9. The method of claim 8, wherein at least some of the protective layer remains over the dielectric in the cutout regions after removing the sacrificial material.

10. The method of claim 1, wherein the sacrificial material includes one or more of SiN or amorphous carbon.

11. A method of forming a NAND string comprising non-volatile storage elements and select gate transistors, the method comprising:

forming a first layer of polysilicon;

forming a dielectric over the first layer of polysilicon;

forming a second layer of polysilicon over the dielectric;

etching through the second layer of polysilicon and the dielectric in regions in which control gates of the select gate transistors are to be formed to expose the first layer of polysilicon;

depositing sacrificial material over the second layer of polysilicon and the exposed portion of the first layer of polysilicon;

forming first stacks for non-volatile storage elements from portions of the first layer of polysilicon, portions of the dielectric, portions of the second layer of polysilicon, and portions of the sacrificial material;

forming second stacks for control gates of the select gate transistors from portions of the first layer of polysilicon and portions of the sacrificial material;

forming insulation in openings between the first stacks and the second stacks;

removing the sacrificial material to reveal first openings in the first stacks and second opening in the second stacks between the insulation; and depositing metal in the first openings and the second openings, control gates of the non-volatile storage elements are formed at least in part from the metal in the first openings and adjacent portions the second layer of polysilicon, control gates of the transistors are formed at least in part from the metal in the second openings and adjacent portions of first layer of polysilicon.

12. The method of claim 11, further comprising depositing a barrier layer over the exposed first layer of polysilicon after etching through the second layer of polysilicon and the dielectric and prior to forming metal in the first openings and the second openings.

13. The method of claim 12, wherein the barrier layer includes a material that prevents silicidation of the first layer of polysilicon.

14. The method of claim 11, wherein the etching the second layer of polysilicon and the dielectric creates cutout regions where control gates of the select gate transistors are to be formed, the cutout regions expose portions of the dielectric, and further comprising depositing a protective layer of polysilicon at least over the exposed dielectric in the cutout regions prior to depositing the sacrificial material in the cutout regions.

15. The method of claim 14, wherein at least some of the protective layer of polysilicon remains over the dielectric in the cutout regions after removing the sacrificial material.

16. The method of claim 11, wherein the sacrificial material includes one or more of SiN or amorphous carbon.

17. The method of claim 11, wherein the dielectric and the sacrificial material each include nitride.

* * * * *